United States Patent
Kim et al.

(10) Patent No.: US 11,397,308 B2
(45) Date of Patent: Jul. 26, 2022

(54) CAMERA MODULE AND OPERATION METHOD THEREFOR

(71) Applicant: LG INNOTEK CO., LTD., Seoul (KR)

(72) Inventors: Min Kim, Seoul (KR); Jun Seok Oh, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 46 days.

(21) Appl. No.: 17/055,000

(22) PCT Filed: May 9, 2019

(86) PCT No.: PCT/KR2019/005596
§ 371 (c)(1),
(2) Date: Nov. 12, 2020

(87) PCT Pub. No.: WO2019/216676
PCT Pub. Date: Nov. 14, 2019

(65) Prior Publication Data
US 2021/0215905 A1    Jul. 15, 2021

(30) Foreign Application Priority Data
May 11, 2018  (KR) .......................... 10-2018-0054081

(51) Int. Cl.
*G02B 7/28*     (2021.01)
*G01D 5/14*     (2006.01)
(Continued)

(52) U.S. Cl.
CPC .............. *G02B 7/28* (2013.01); *G01D 5/145* (2013.01); *G03B 13/36* (2013.01); *G03B 17/12* (2013.01); *H04N 5/2254* (2013.01)

(58) Field of Classification Search
CPC . G02B 7/28; G02B 7/08; G03B 13/36; G03B 17/12; G03B 3/10; G03B 30/00;
(Continued)

(56) References Cited

U.S. PATENT DOCUMENTS 5,483,162 A  * 1/1996 Ushikoshi .............. G01P 3/487
                                                     324/252
7,132,824 B2 * 11/2006 Masuda ............. H04N 5/23248
                                                     324/207.2
(Continued)

FOREIGN PATENT DOCUMENTS

CN      101930150 A     12/2010
CN      103728819 A     4/2014
(Continued)

OTHER PUBLICATIONS

Extended European Search Report for European Application No. 19800813.8, dated Jan. 7, 2022.

*Primary Examiner* — Pritham D Prabhakher
(74) *Attorney, Agent, or Firm* — Birch, Stewart, Kolasch & Birch, LLP

(57) ABSTRACT

A camera module, according to one embodiment, comprises: a lens assembly; a lens driving unit for moving the lens assembly in the direction of the optical axis; a position sensor unit for detecting the position of the lens assembly; and a control unit for, on the basis of the position of the lens assembly detected by the position sensor unit, outputting, to the lens driving unit, a drive signal for moving the lens assembly to a target position, wherein the position sensor unit comprises a plurality of sensor units which have at least one output terminal connected with each other, an amplifier which is commonly connected with the plurality of sensor units, and an analog-digital converter which is connected to the amplifier.

8 Claims, 23 Drawing Sheets

(51) Int. Cl.
*G03B 13/36* (2021.01)
*G03B 17/12* (2021.01)
*H04N 5/225* (2006.01)

(58) Field of Classification Search
CPC ........... G03B 2205/0069; G01D 5/145; H04N 5/2254; G01R 33/072
USPC ........................................................ 348/345
See application file for complete search history.

(56) References Cited

U.S. PATENT DOCUMENTS

| | | | | |
|---|---|---|---|---|
| 8,190,014 | B2* | 5/2012 | Tsuda | G02B 7/38 |
| | | | | 396/133 |
| 8,306,410 | B2* | 11/2012 | Kang | G03B 5/02 |
| | | | | 348/208.11 |
| 8,760,524 | B2* | 6/2014 | Yun | H04N 5/23258 |
| | | | | 348/208.1 |
| 8,995,241 | B1 | 3/2015 | Heo et al. | |
| 9,749,538 | B2* | 8/2017 | Ishikawa | H04N 5/2253 |
| 9,990,522 | B2* | 6/2018 | Bottazzi | G06K 7/10722 |
| 10,175,449 | B2 | 1/2019 | Heo et al. | |
| 10,365,121 | B2* | 7/2019 | Wong | G03B 3/10 |
| 10,404,919 | B2* | 9/2019 | Yu | G02B 27/646 |
| 10,473,949 | B2* | 11/2019 | Tokoro | H02K 41/0354 |
| 10,656,374 | B2 | 5/2020 | Kim et al. | |
| 2002/0075070 | A1 | 6/2002 | Sakuragi | |
| 2005/0258825 | A1 | 11/2005 | Masuda et al. | |
| 2007/0297780 | A1* | 12/2007 | Enomoto | G03B 5/02 |
| | | | | 348/E5.025 |
| 2009/0295978 | A1 | 12/2009 | Yun | |
| 2011/0176015 | A1 | 7/2011 | Yun | |
| 2012/0063756 | A1 | 3/2012 | Kang et al. | |
| 2013/0258056 | A1* | 10/2013 | Jang | G03B 35/04 |
| | | | | 348/46 |
| 2016/0231528 | A1* | 8/2016 | Wong | G02B 7/36 |
| 2017/0006229 | A1 | 1/2017 | Ishikawa | |
| 2017/0324905 | A1 | 11/2017 | Yu | |
| 2018/0004994 | A1* | 1/2018 | Bottazzi | G06K 7/10722 |
| 2018/0217396 | A1* | 8/2018 | Tokoro | H02K 41/0354 |
| 2019/0373145 | A1 | 12/2019 | Yu et al. | |

FOREIGN PATENT DOCUMENTS

| | | |
|---|---|---|
| JP | 8-29661 A | 2/1996 |
| JP | 4049125 B2 | 2/2008 |
| JP | 2017-15900 A | 1/2017 |
| KR | 10-2006-0089089 A | 8/2006 |
| KR | 10-2011-0085141 A | 7/2011 |
| KR | 10-1588951 B1 | 1/2016 |
| KR | 10-2019-0128279 A | 11/2019 |
| KR | 10-2019-0138344 A | 12/2019 |
| WO | WO 2017/078328 A1 | 5/2017 |

\* cited by examiner

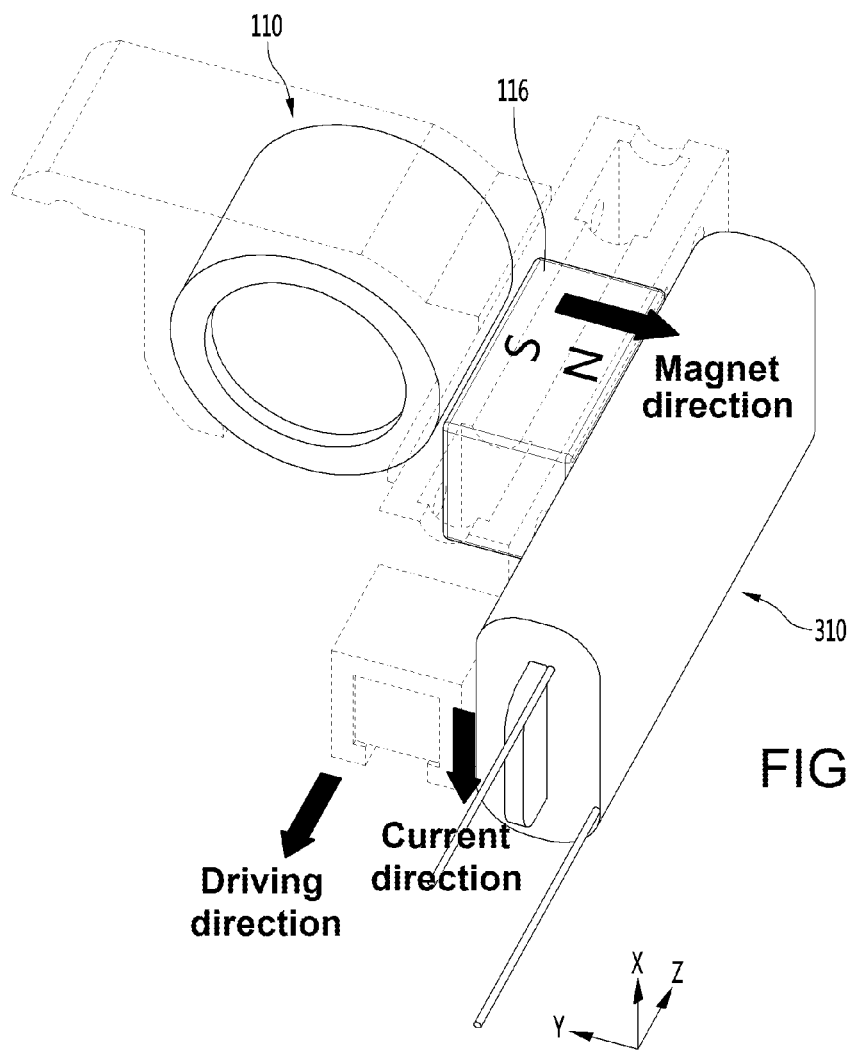

(a)

(b)

CAMERA MODULE AND OPERATION METHOD THEREFOR

CROSS REFERENCE TO RELATED APPLICATIONS

This application is the National Phase of PCT/KR2019/005596 filed on May 9, 2019, which claims priority under 35 U.S.C. § 119(a) to Patent Application No. 10-2018-0054081 filed in the Republic of Korea on May 11, 2018, all of which are hereby expressly incorporated by reference into the present application.

TECHNICAL FIELD

The embodiment relates to a camera module and an operation method therefor.

BACKGROUND ART

A camera module performs a function of photographing and storing a subject into an image or video, and is installed in a mobile terminal such as a mobile phone, a laptop, a drone, a vehicle, or the like.

In addition, an ultra-small camera module is accommodated in a portable device such as a smartphone, a tablet PC, and a laptop, and the above camera module may perform an auto focus (AF) function of aligning a focal length of a lens by automatically adjusting a distance between an image sensor and the lens.

The auto focus function is an essential function for clearly photographing a still image or a video in the camera module. In regard to the auto focus function, when a position of a lens barrel mounted therein with a magnet is detected using a position sensor, and a driving signal is provided to a driving unit according to the detected position of the lens barrel and an inputted target position, a driving force is generated between a coil of the driving unit and the magnet mounted in the lens barrel, so that the position of the lens barrel moves to a focus position, thereby performing the auto focus function.

However, the position sensor installed to provide the above-described auto focus function may provide a detection signal including ambient noise and the like, and accordingly, the position of the lens barrel cannot be adjusted to an accurate position.

In addition, the camera module provided in the portable device has electromagnetic components close to components of the camera module, and accordingly, has high-frequency noise properties, so the low noise technology is essential. In addition, the conventional position sensor may improve the noise properties through signal processing at a stage of the driving unit, but there is a limit of improving the noise properties only by the signal processing.

DETAILED DESCRIPTION OF THE INVENTION

Technical Problem

The embodiment according to the present invention provides a camera module and an operation method therefor to increase a position detection range by detecting a position of the lens barrel based on differential signals from a plurality of position sensors.

In addition, the embodiment according to the present invention provides a camera module and an operation method therefor to acquire a differential value at a front-end terminal of a sensing unit.

In the proposed embodiment, the technical problems to be solved are not limited to the technical problems mentioned above, and other technical problems not mentioned herein may be clearly understood by a person having ordinary skill in the art according to the embodiment proposed from the following description.

Technical Solution

The camera module according to the embodiment includes a lens assembly; a lens driving unit for moving the lens assembly in an optical axis direction; a position sensor unit for detecting a position of the lens assembly; and a control unit configured to output a driving signal, for moving the lens assembly to a target position, to the lens driving unit based on the position of the lens assembly detected through the position sensor unit, wherein the position sensor unit includes a plurality of sensor units with at least one output terminal interconnected to each other, an amplifier commonly connected to the sensor units, and an analog-to-digital converter connected to the amplifier.

In addition, the amplifier includes an inverting terminal and a non-inverting terminal. The inverting terminal of the amplifier may be connected to a first output terminal of a first sensor unit among the sensor units, and may be connected to a second output terminal of a second sensor unit different from the first sensor unit among the sensor units.

In addition, the first sensor unit may be a sensor unit disposed firstly among the sensor units, and the second sensor unit may be a sensor unit disposed lastly among the sensor units.

In addition, the first sensor unit may be a first Hall sensor, the second sensor unit may be a second Hall sensor, the first output terminal may be an output terminal of a positive polarity of the first Hall sensor, and the second output terminal may be an output terminal of a negative polarity of the second Hall sensor.

In addition, an output terminal having a negative polarity of the first Hall sensor may be connected to an output terminal having a positive polarity of the second Hall sensor.

In addition, the first sensor unit may be a first induction coil, the second sensor unit may be a second coil, the first output terminal may be one end of the first induction coil, the second output terminal may be an opposite end of the second induction coil, and an opposite end of the first induction coil may be connected to one end of the second induction coil.

In addition, the sensor units further includes a third Hall sensor disposed between the first and second Hall sensors. An output terminal having a positive polarity of the third Hall sensor may be connected to an output terminal having a negative polarity of the first Hall sensor, and an output terminal having a negative polarity of the third Hall sensor may be connected to the output terminal having the positive polarity of the second Hall sensor.

In addition, the camera module further includes a switch having one end connected to the inverting terminal of the amplifier and an opposite end selectively connected to any one of the output terminal having the negative polarity of the first Hall sensor and the output terminal having the negative polarity of the second Hall sensor.

In addition, the lens assembly includes a first lens assembly including a zoom lens group, and a second lens assembly including a focus lens group, and the position sensor unit includes a first position sensor unit that detects a position of the first lens assembly, and a second position sensor unit that detects a position of the second lens assembly.

Meanwhile, an operation method for the camera module according to the embodiment includes: determining a sensing condition of a position sensor unit; allowing an inverting terminal of an amplifier to be connected to one of an output terminal of a first sensing unit and an output terminal of a last sensing unit among a plurality of sensing units, by controlling a switch according to the determined sensing condition; detecting a position of a lens assembly corresponding to a detection signal inputted to the amplifier by controlling the switch; and moving the lens assembly to a target position according to the detected position, wherein the detecting step includes: receiving an output signal of the first sensing unit when the inverting terminal is connected to the output terminal of the first sensing unit; and receiving a differential signal according to a combination of the sensing units when the inverting terminal is connected to the output terminal of the last sensing unit.

In addition, each of the sensing units may include a plurality of output terminals, and at least one of the output terminals of the each sensing unit may be connected to an output terminal of another neighboring sensing unit. [ADVANTAGEOUS EFFECTS OF THE INVENTION] In the embodiment according to the present invention, a plurality of position sensors may be interconnected, so that only the output terminal of the position sensor disposed at the outermost side can be connected to an amplifier. Thus, according to the present invention, differential signals for the position sensors can be inputted to an input terminal of the amplifier.

According to the present invention, a differential sensing scheme can be provided in which a detection range becomes wider compared to a single sensing scheme. In addition, according to the present invention, a differential signal according to a combination of the position sensors may be inputted to the input terminal of the amplifier, so that an influence of offset noise in a path to a signal processing unit of a driving unit can be minimized.

In addition, according to the present invention, differential signals for the position sensors are outputted in the sensing unit including the position sensors, the amplifier, and the analog-to-digital converter, so that the number of patterns/pins connected from the driving unit to a printed circuit board can be minimized, and accordingly, a space of the printed circuit board can be saved.

In addition, according to the present invention, the differential value for the position sensors may be obtained with respect to common mode noise, so that excellent characteristics not only for internal noise but also for external noise can be implemented.

In addition, according to the present invention, only a detection signal of a specific position sensor can be transmitted to a terminal of the amplifier, or differential signals for a plurality of position sensors can be transmitted, according to the usage environment of the camera module. Thus, according to the present invention, optimal detection signals can be acquired in an environment in which the sensing sensitivity is required to be large and an environment in which the sensing range is required to be large.

ADVANTAGEOUS EFFECTS OF THE INVENTION

FIG. 1 is a perspective view of a camera module according to one embodiment.

FIG. 2 is a perspective view after removing a cover from the camera module according to the embodiment shown in FIG. 1.

FIG. 3a is a perspective view of a mount in the camera module according to the embodiment shown in FIG. 2.

FIG. 3b is a perspective view after removing the mount from the camera module according to the embodiment shown in FIG. 2.

FIG. 4a is a perspective view of a first lens assembly in the camera module according to the embodiment shown in FIG. 2.

FIGS. 4b and 4c are perspective views of a second lens assembly in the camera module according to the embodiment shown in FIG. 2.

FIG. 5a is a conceptual diagram of a first magnetization scheme of a magnet in the camera module according to the embodiment shown in FIG. 3b.

FIG. 5b is a conceptual diagram of a second magnetization scheme of a magnet in the camera module according to the embodiment shown in FIG. 3a.

FIG. 6 is a plan view of the camera module according to the embodiment shown in FIG. 2.

FIG. 7a is a sectional view taken along line A1-A1' of the camera module according to the embodiment shown in FIG. 6.

FIG. 7b is a sectional view taken along line A2-A2' of the camera module according to the embodiment shown in FIG. 6.

FIG. 7c is a sectional view taken along line A3-A3' of the camera module according to the embodiment shown in FIG. 6.

FIG. 8 is a block diagram showing an internal configuration of the camera module according to the embodiment of the present invention.

FIG. 9 is a block diagram showing a detailed configuration of a position sensor unit of FIG. 8.

FIGS. 10a to 10d are diagrams for explaining a connection relationship of the sensor unit of FIG. 9.

FIG. 11 is a diagram comparing a connection relationship of a sensor unit according to a Comparative Example and a connection relationship of the sensor unit according to the present invention.

FIG. 12 is a diagram for explaining a connection relationship of a sensor unit according to another embodiment of the present invention.

FIG. 13 is a view showing a detection range of a position sensor unit according to the Comparative Example.

FIG. 14 is a view showing a detection range of a position sensor unit according to the embodiment of the present invention.

FIG. 15 is a block diagram showing a detailed configuration of a position sensor unit according to another embodiment of the present invention.

FIG. 16 is a flow chart for explaining an operation method for the camera module step-by-step according to the embodiment of the present invention.

DESCRIPTION OF THE DRAWINGS

Hereinafter, the embodiments will be described in detail with reference to the accompanying drawings.

Meanwhile, when the embodiments are described being formed in "upper/lower" or "on/under" of each element, the "upper/lower" or ""on/under"" includes that both the elements are in direct contact with each other, or at least one another element is indirectly disposed between the both elements. In addition, the expression ""upper/lower" or "on/under" may include not only the upward direction but also the downward direction with respect to one element.

In addition, the relational terms such as "upper/over/on" and "lower/below/down" used hereinafter do not require or imply any physical or logical relationship or order between such components or elements, and may be used to distinguish one component or element from other components or elements.

In addition, the terms, such as "first" and "second", in the description of the embodiment may be used to describe various elements, but these terms are used to distinguish one element from another element. In addition, the terms specifically defined in consideration of the configuration and operation of the embodiment are only for describing the embodiment, and are not intended to limit the scope of the embodiment.

Figure 1:
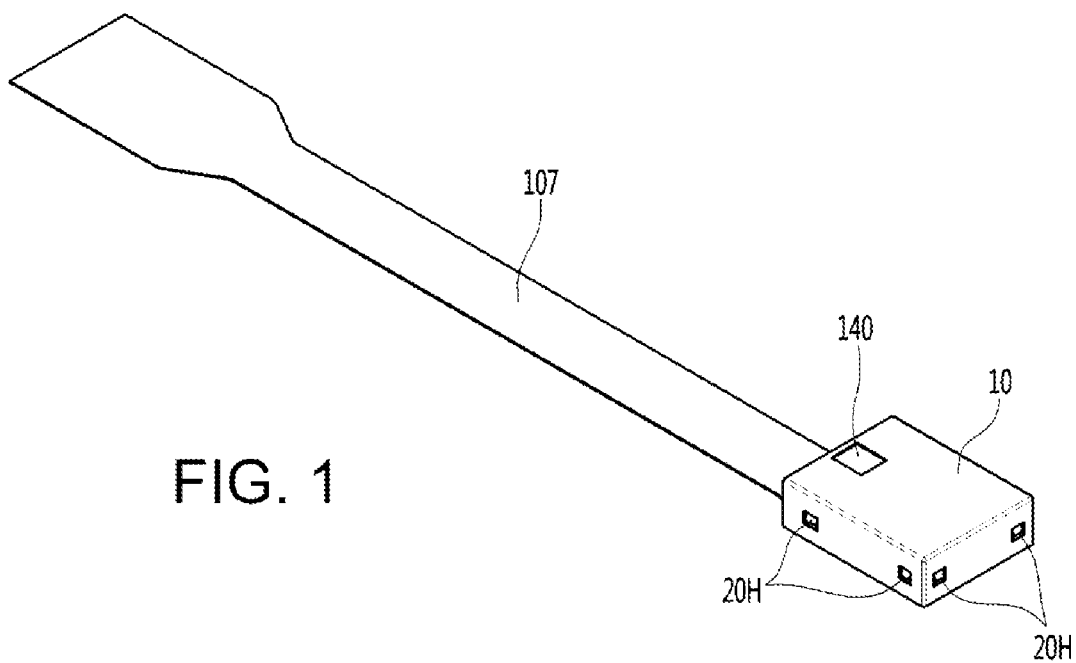
Figure 2:
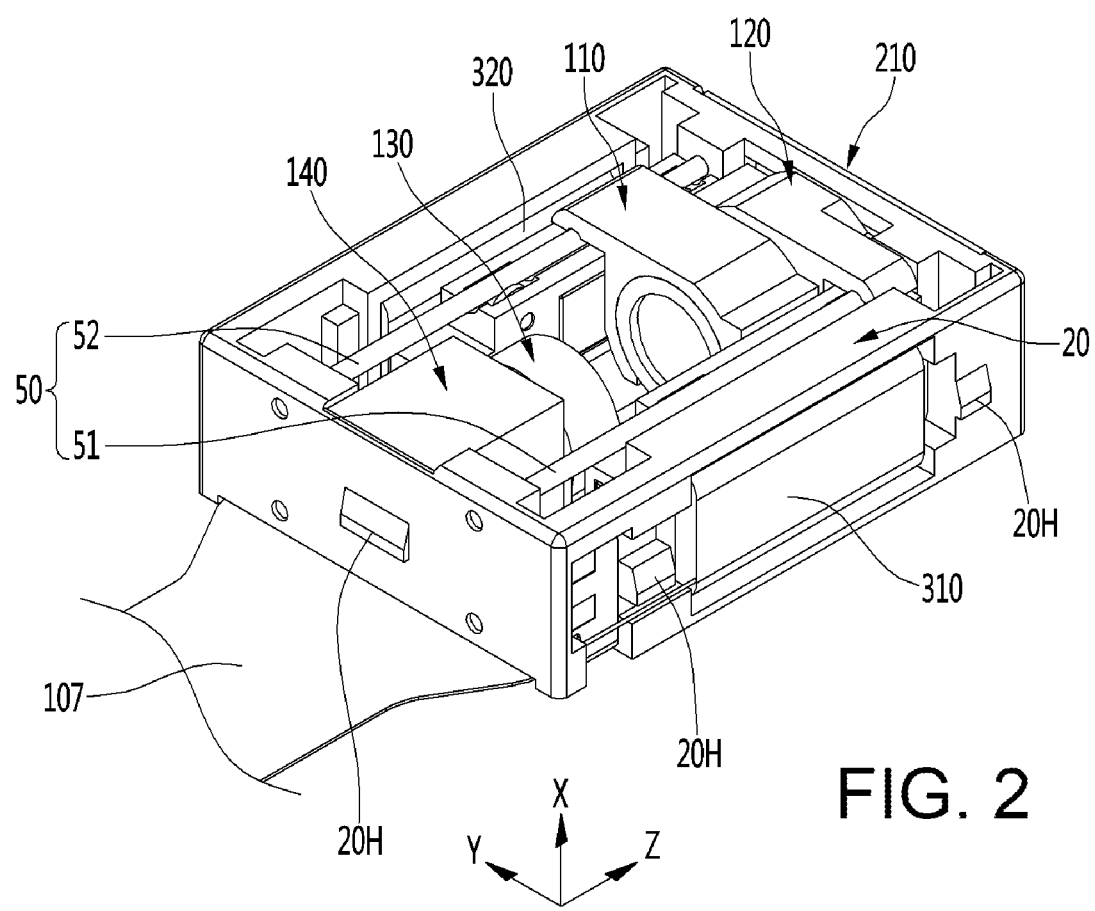

FIG. 1 is a perspective view of a camera module 100 according to the embodiment. FIG. 2 is a perspective view after removing a cover 10 from the camera module 100 according to the embodiment shown in FIG. 1.

First, referring mainly to FIG. 1, in the camera module 100 according to the embodiment, various optical systems may be coupled onto a predetermined mount 20 (see FIG. 2). For example, a prism 140 and lens groups may be disposed on the mount 20, and the cover 10 may be coupled through hooks 20H of the mount 20.

The cover 10 may be coupled to the mount 20. The cover 10 may cover components accommodated in the mount 20, so that the components of the camera module may be protected. The mount 20 may be referred to as a base.

The cover 10 may be coupled to the mount 20 through fitting. In addition, the cover 10 may be coupled to the mount 20 by an adhesive. For example, the hook 20H may protrude from a side surface of the mount 20, the cover 10 may have a hole formed at a position corresponding to the hook H, and the hook of the mount 20 may be mounted in the hole of the cover 10, so that the cover 10 and the mount 20 may be coupled to each other. Further, the cover 10 may be stably coupled to the mount 20 by using the adhesive.

In addition, a circuit board 107 may be disposed under the mount 20. In addition, the circuit board 107 may be electrically connected to lens driving units disposed inside the mount 20.

Next, referring to FIG. 2, according to the camera module 100 according to the embodiment, an optical system and a lens driving unit may be disposed in the mount 20. For example, the camera module 100 according to the embodiment may include at least one of a first lens assembly 110, a second lens assembly 120, a lens group 130, a prism 140, a first driving unit 310, a second driving unit 320, a rod 50, and an image sensor unit 210.

The first lens assembly 110, the second lens assembly 120, the third lens group 130, the prism 140, the image sensor unit 210, and the like may be classified as an optical system.

In addition, the first driving unit 310, the second driving unit 320, the rod 50, and the like may be classified as a lens driving unit, and the first lens assembly 110 and the second lens assembly 120 may also function as the lens driving unit. The first driving unit 310 and the second driving unit 320 may be a coil driving unit, but the present invention is not limited thereto.

The rod 50 may function as a guide for a moving lens assembly, and a single rod or a plurality of rods may be provided. For example, the rod 50 may include a first rod 51 and a second rod 52, but the present invention is not limited thereto.

In axial directions shown in FIG. 2, a Z-axis denotes an optical axis direction or a direction parallel thereto. A Y-axis denotes a direction perpendicular to the Z-axis on the ground (Y-Z plane). An X-axis denotes a direction perpendicular to the ground.

In the embodiment, the prism 140 converts incident light into parallel light. For example, the prism 140 converts the incident light into the parallel light by changing an optical path of the incident light into the optical axis Z parallel to a central axis of the lens group. Then, the parallel light may pass through the third lens group 130, the first lens assembly 110, and the second lens assembly 120, and enter the image sensor unit 210 so that an image may be captured.

Hereinafter, two moving lens groups will be described as being provided in the description of the embodiment, but the present invention is not limited thereto, and 3, 4, 5 or more moving lens groups may be provided. In addition, the optical axis direction Z refers to a direction in which the lens groups are aligned or a direction parallel thereto.

The camera module according to the embodiment may perform a zooming function. For example, in the embodiment, the first lens assembly 110 and the second lens assembly 120 may be moving lenses that move through the first driving unit 310, the second driving unit 320, and the rod 50, and the third lens group 130 may be a fixed lens.

For example, in the embodiment, the first lens assembly 110 and the second lens assembly 120 may include a moving lens group, and the third lens group 130 may be a fixed lens group.

The third lens group 130 may function as a focator for imaging the parallel light at a specific position.

In addition, the first lens assembly 110 may function as a variator for re-imaging the image formed by the third lens group 130 as the focator at another position. Meanwhile, since a distance to a subject or an image distance varies significantly, the magnification may be significantly changed in the first lens assembly 110, and the first lens assembly 110 as the variator may serve as an important factor for the focal length or the magnification change of the optical system.

Meanwhile, an image point formed at the first lens assembly 110 as the variator may slightly differ according to the position.

Accordingly, the second lens assembly 120 may perform a position compensation function for the image formed by the variator. For example, the second lens assembly 120 may function as a compensator for performing a role of accurately forming the image point, which is formed by the first lens assembly 110 as the variator, at a position of an actual image sensor unit 210.

For example, the first lens assembly 110 may be a zoom lens assembly that performs a zooming function, and the second lens assembly 120 may be a focus lens assembly that performs a focus function.

Hereinafter, features of the camera module according to the embodiment will be described in detail with reference to FIGS. 3a to 5d.

Figure 3A:
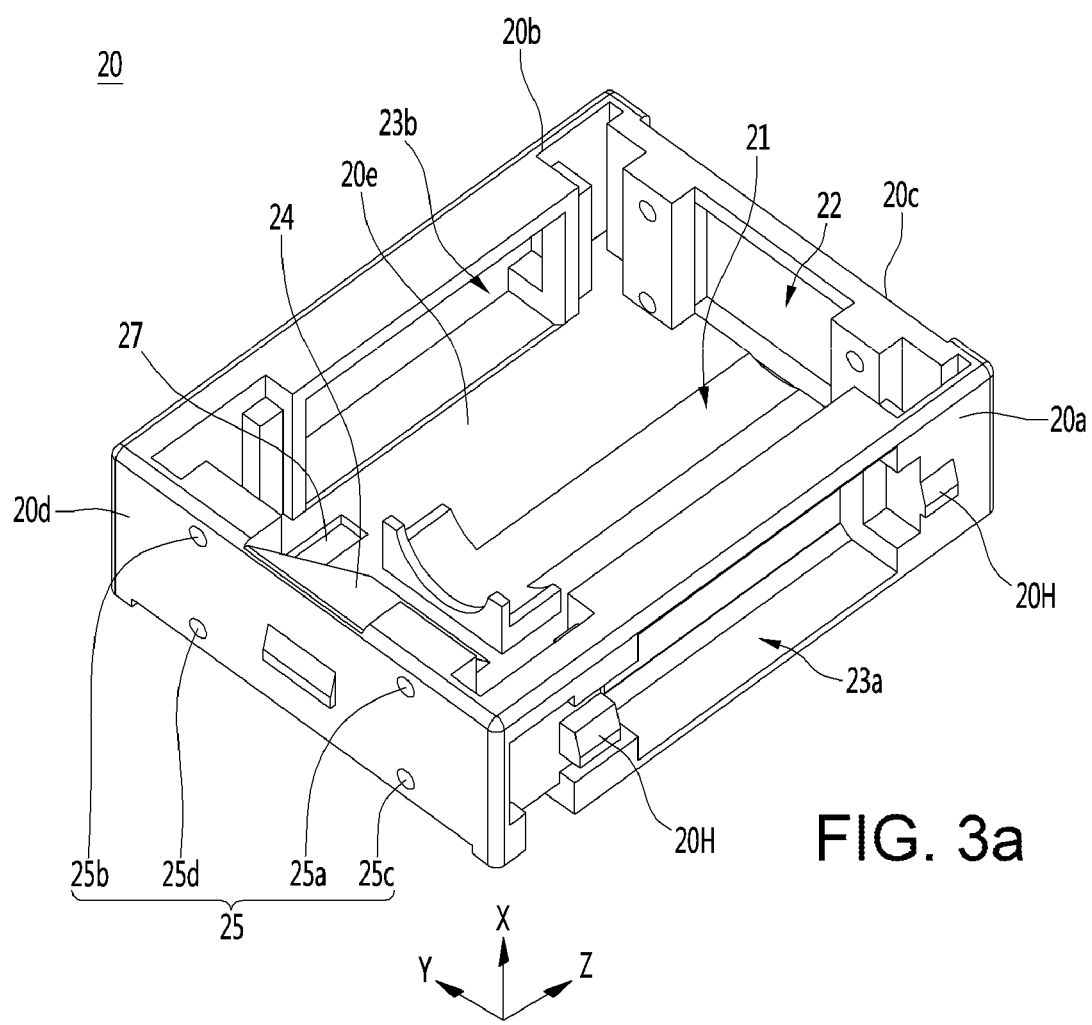

First, FIG. 3a is a perspective view of the mount 20 in the camera module according to the embodiment shown in FIG. 2. The mount 20 may have a rectangular parallelepiped shape, and may include four side surfaces and a bottom surface 20e. For example, the mount 20 may include first to fourth sides 20a, 20b, 20c, and 20d, the first side surface 20a may face the second side surface 20b, and the third side surface 20c may face the fourth side surface 20d.

A hook 20H may be formed on at least one side surface of the mount 20 and coupled to a hole in the cover 10.

In addition, a first guide groove 112G, in which the first lens assembly 110, the second lens assembly 120, and the third lens group 130 are disposed, may be formed in the optical axis direction Z on the bottom surface 20e of the mount 20. The first guide groove 112G may be concave downward according to an outer peripheral shape of a lens, but the present invention is not limited thereto.

In addition, a first opening 23a and a second opening 23b, in which the first driving unit 310 and the second driving unit 320 are disposed, may be formed in the first side surface 20a and the second side surface 20b of the mount 20, respectively. In addition, a third opening 22, in which the image sensor unit 210 is disposed, may be formed in the third side surface 20c of the mount 20.

In addition, a single or a plurality of fourth openings 27, through which the circuit board 107 is exposed, may be formed in the bottom surface of the mount 20.

In addition, a single or a plurality of coupling holes 25, to which the rod 50 is coupled, may be formed in each of the third side surface 20c of the mount 20 and the fourth side surface 20d facing the third side surface 20d. For example, a first coupling hole 25a, a second coupling hole 25b, a third coupling hole 25c, and a fourth coupling hole 25d may be formed in the third side surface 20c and the fourth side surface 20d of the mount 20, and a first rod 51, a second rod 52, a third rod 53, and a fourth rod 54 may be coupled thereto, respectively.

In addition, a prism mounting portion 24 for disposing the prism 140 may be formed inside the fourth side surface 20d of the mount 20.

The mount 20 may be formed of at least one of plastic, glass-based epoxy, polycarbonate, metal, or composite material.

Figure 3B:
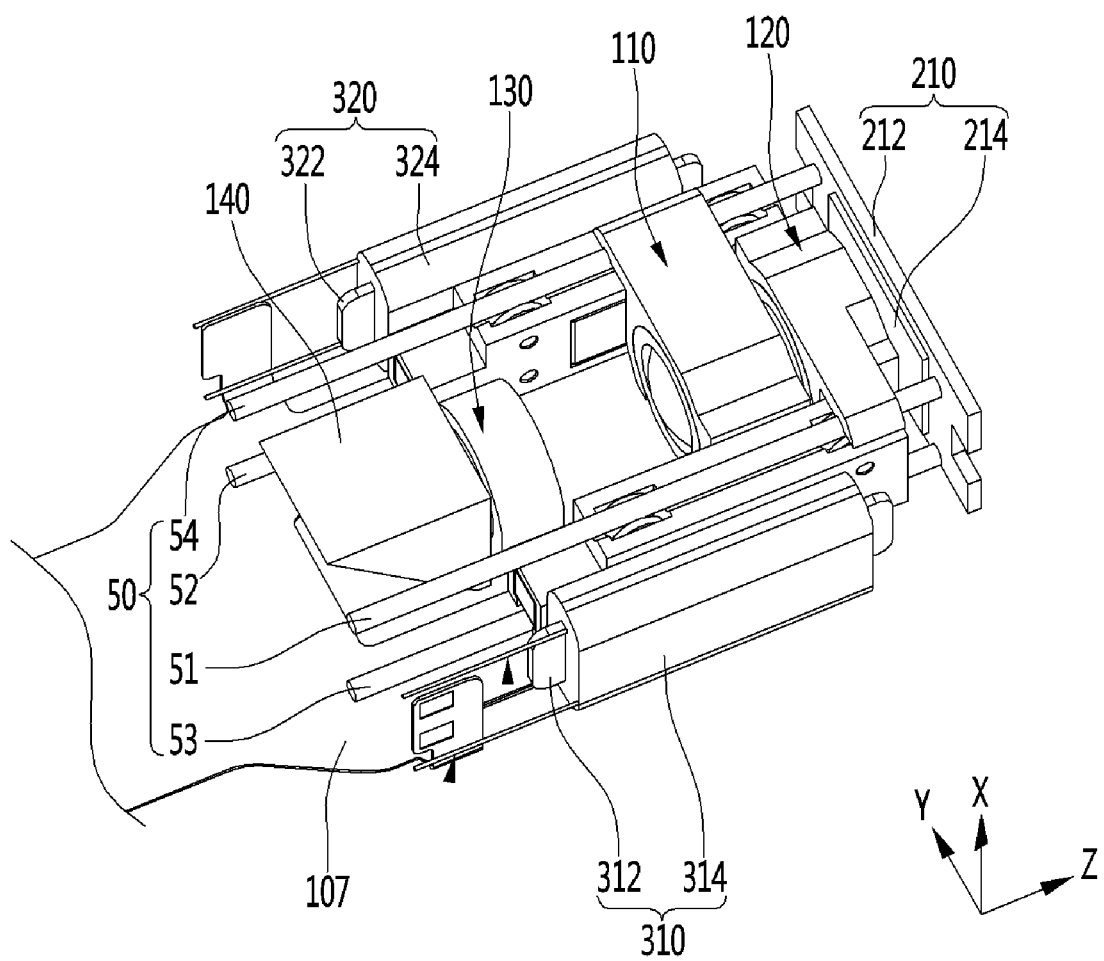

Next, FIG. 3b is a perspective view after removing the mount 20 from the camera module according to the embodiment shown in FIG. 2, and shows an optical system and a lens driving unit.

In the embodiment, the lens driving unit may include a mover and a fixture. The mover is a concept corresponding to the fixture and may be referred to as a moving portion. For example, the mover may denote a lens assembly moved by a rolling motion of a wheel. In contrast, the fixture may denote a mount, a rod, or the like that is not moved.

The camera module according to the embodiment may include an optical system such as the prism 140, the first lens assembly 110, the second lens assembly 120, the third lens group 130, and the image sensor unit 210 on the mount 20. In addition, the camera module according to the embodiment may include a lens driving unit such as the first driving unit 310, the second driving unit 320, and the rod 50. The first lens assembly 110 and the second lens assembly 120 may also perform a lens driving function.

The rod 50 may include first to fourth rods 51, 52, 53, and 54, and the first to fourth rods 51, 52, 53, and 54 are coupled to the first to fourth coupling holes 25a, 25b, 25c, and 25d, respectively (see FIG. 3A), thereby functioning as a guide for moving the first lens assembly 110 and the second lens assembly 120. The rod 50 may be formed of at least one of plastic, glass-based epoxy, polycarbonate, metal, or composite material.

The first driving unit 310 may be a coil driving unit, and may have a shape in which a first coil 314 is wound around a first core 312 such as an iron core. In addition, the second driving unit 320 may also be a coil driving unit in which a second coil 324 is wound around a second core 322 such as an iron core.

First, the prism 140 changes incident light into parallel light by changing an optical path of the incident light into an optical axis parallel to the central axis Z of the lens group. Thereafter, the parallel light may pass through the third lens group 130, the first lens assembly 110, and the second lens assembly 120, thereby being captured by the image sensor unit 210.

The prism 140 may be an optical member having a triangular column shape. In addition, in the embodiment, a reflective plate or a reflective mirror may be selected instead of the prism 140.

In addition, according to the embodiment of the present invention, when the image sensor unit 210 is not disposed in a direction perpendicular to the optical axis, an additional prism (not shown) may be further provided such that the light passing through the lens group is imaged by the image sensor unit 210.

In the embodiment, the image sensor unit 210 may be disposed perpendicular to the optical axis direction of the parallel light. The image sensor unit 210 may include a solid-state imaging device 214 disposed on a second circuit board 212. For example, the image sensor unit 210 may include a charge coupled device (CCD) image sensor or a complementary metal-oxide-semiconductor (CMOS) image sensor.

In the embodiment, a first lens assembly 110 and a second lens assembly 120 will be described in detail with reference to FIGS. 4a and 4b.

Figure 4A:
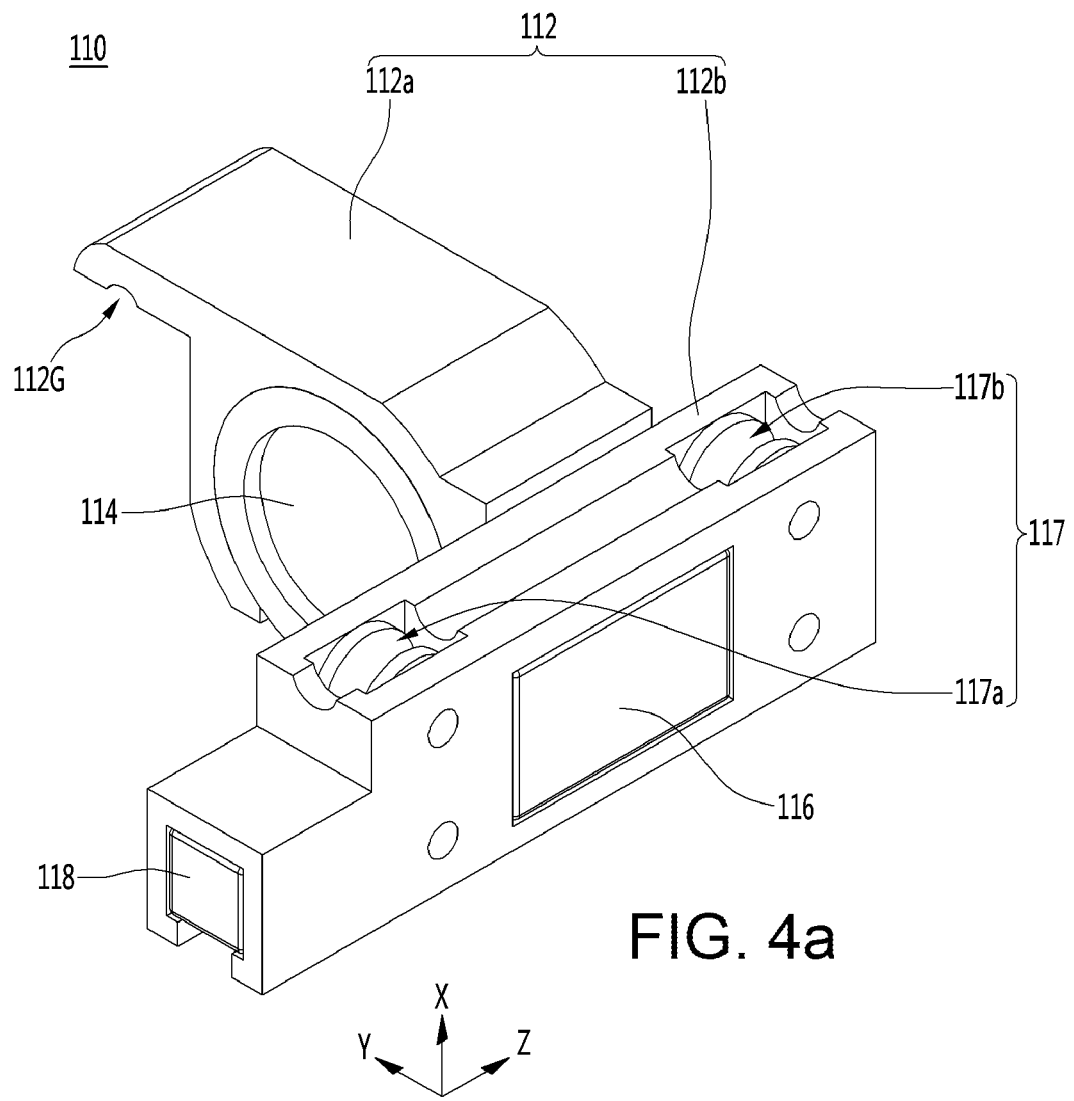

FIG. 4a is a perspective view of the first lens assembly 110 in the camera module according to the embodiment shown in FIG. 2. FIG. 4b is a perspective view of the second lens assembly 120 in the camera module according to the embodiment shown in FIG. 2.

Referring to FIG. 4a, the first lens assembly 110 according to the embodiment may include at least one of a first housing 112, a first lens group 114, a first wheel 117, a third driving unit 116, and a first position sensor 118.

Figure 4B:
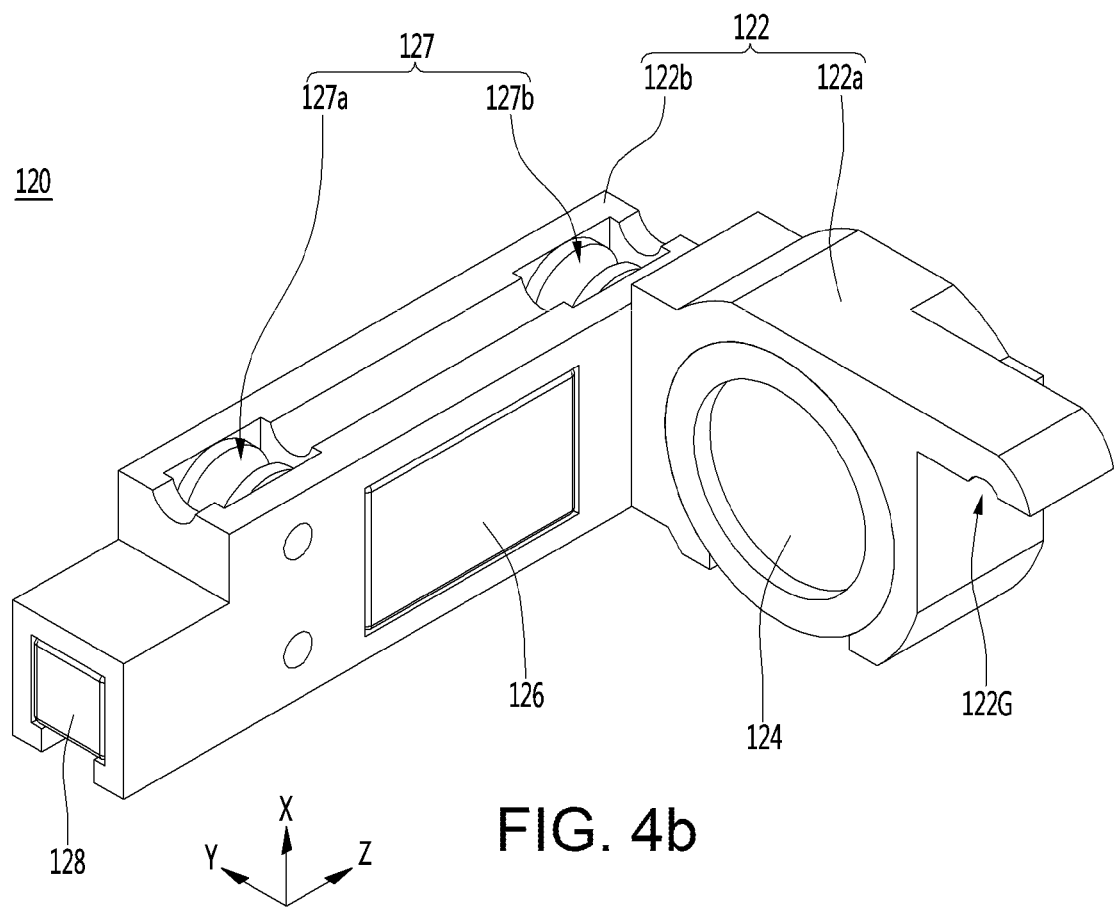
Figure 4C:
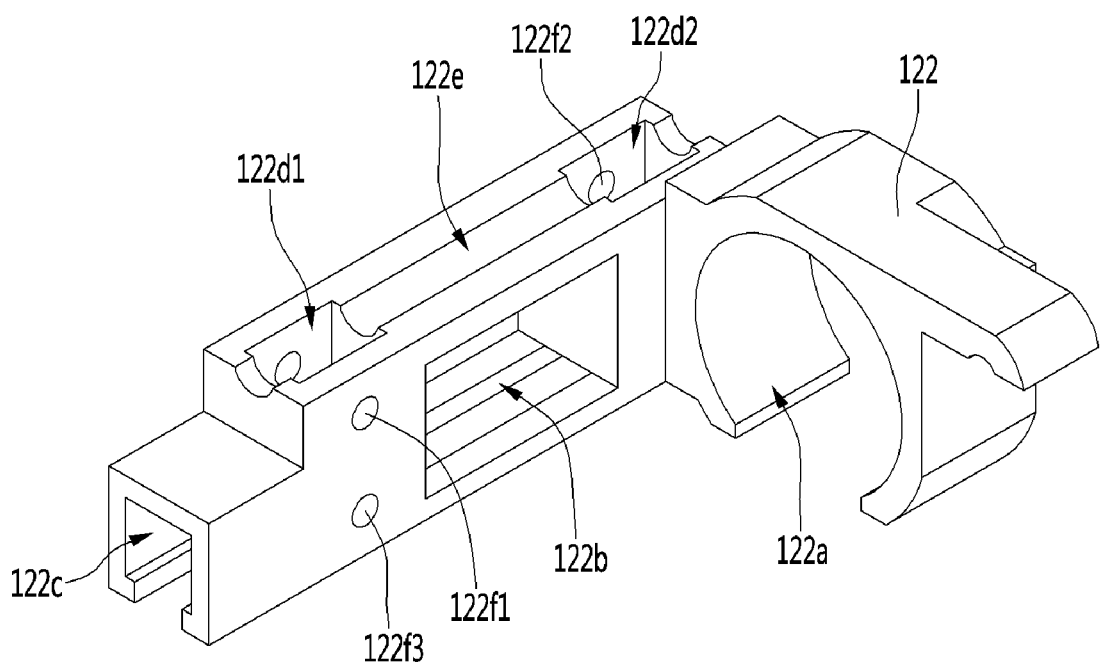

In addition, referring to FIG. 4b, the second lens assembly 120 according to the embodiment may include at least one of a second housing 122, a second lens group 124, a second wheel 127, a fourth driving unit 126, and a second position sensor 128.

Hereinafter, the first lens assembly 110 will be mainly described.

The first housing 112 of the first lens assembly 110 may include a first lens housing 112a and a first driving unit housing 112b. The first lens housing 112a may function as a lens barrel, and the first lens group 114 may be mounted therein. The first lens group 114 may be a moving lens group, and may include a single or a plurality of lenses. The second housing 122 of the second lens assembly 120 may also include a second lens housing 122a and a second driving unit housing 122b.

A first guide groove 112G may be formed in a lower side of one end of the first lens housing 112a of the first lens assembly 110. The first lens assembly 110 may be guided by the first guide groove 112G thereby moving in a straight line in the optical axis direction while sliding contact with the second rod 52. In addition, a second guide groove 122G may be formed in a lower side of one end of the second lens housing 122a of the second lens assembly 120.

In the embodiment, since the first housing 112 is provided to move in the optical axis direction by the sliding contact between the second rod 52 and the first guide groove 112G, a camera module, which performs efficient auto focusing and zoom functions, may be implemented.

In addition, in the embodiment, since the seek housing 122 is provided to move in the optical axis direction by the sliding contact between the first rod 51 and the second guide groove 122G, a camera module, which performs efficient auto focusing and zoom functions, may be implemented.

Next, a third driving unit 116, a first wheel 117, and a first position sensor 118 may be disposed in the first driving unit housing 112b of the first lens assembly 110. The first wheel 117 may include a plurality of wheels, and may include a first-1 wheel 117a, and a first-2 wheel 117b.

In addition, a fourth driving unit 126, a second wheel 127, and a second position sensor 128 may be disposed in a second driving unit housing 122b of the second lens assembly 120. The second wheel 127 may include a plurality of wheels, and may include a second-1 wheel 127a, and a second-2 wheel 127b.

The third driving unit 116 of the first lens assembly 110 may be a magnet driving unit, but the present invention is not limited thereto. For example, the third driving unit 116 may include a first magnet that is a permanent magnet. In addition, the fourth driving unit 126 of the second lens assembly 120 may also be a magnet driving unit. However, the present invention is not limited thereto.

For example, FIG. 5a is a conceptual diagram of a first magnetization scheme of the first magnet in the third driving unit 116 of the first lens assembly 110, in which an N pole of the permanent magnet may be arranged to face the first driving unit 310, and an S pole may be positioned on the opposite side of the first driving unit 310.

In this case, a direction of an electromagnetic force becomes horizontal with the optical axis direction based on the Fleming's left-hand rule, so that the first lens assembly 110 may be driven.

Particularly, in the embodiment, as shown in FIG. 4a, there is a technical advantage that the first wheel 117 as a rolling driving unit is provided in the first lens assembly 110 to move on the rod 50, thereby minimizing a friction torque.

Accordingly, the lens assembly, the lens driving device, and the camera module including the same according to the embodiment may minimize a friction torque between the lens assembly moved during zooming and the guide rod, so that a driving power can be improved. Thus, according to the embodiment, there are technical advantages that a power consumption can be reduced when the camera module performs the zooming, and control properties can be improved.

Figure 5B:
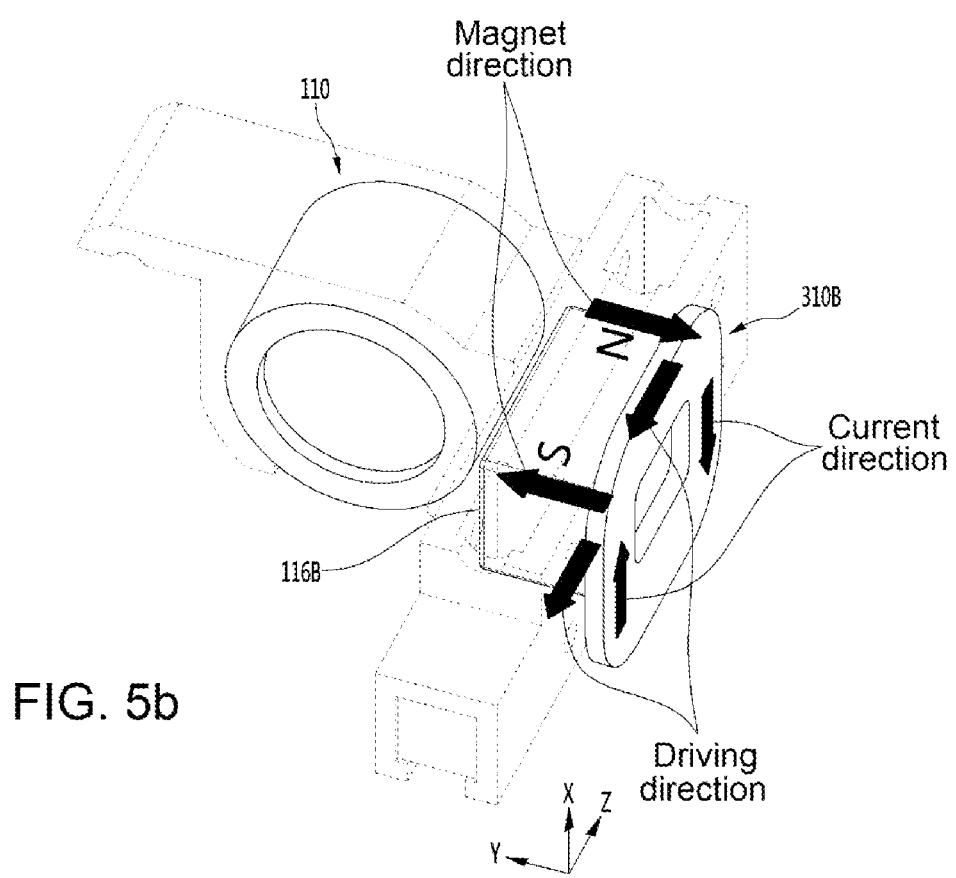

Meanwhile, FIG. 5b is a conceptual diagram of a second magnetization scheme of a magnet serving as a first driving unit 1166 in the camera module according to the embodiment.

FIG. 5a shows the first driving unit 310 in which a first coil 314 is wound around a bar-shaped first core 312 (see FIG. 3b). In contrast, FIG. 5b shows a first-2 driving unit 310B in which a coil is wound around a doughnut-shaped core.

Accordingly, in the first driving unit 310 of FIG. 5a, a current in an area facing the third driving unit 116 has one direction.

In contrast, in the first-2 driving unit 310B of FIG. 5b, the direction of the current in an area facing the third driving unit 116 is not the same.

Accordingly, both the N and S poles of the permanent magnet as a third-2 driving unit 116B may be disposed to face the first-2 driving unit 310B.

Referring back to FIG. 4a, the first position sensor 118 may be disposed in the first driving unit housing 112b of the first lens assembly, so that a position detection and a position control of the first lens assembly 110 may be performed. For example, the first position sensor 118 disposed on the first driving unit housing 112b may be disposed to face a first sensing magnet (not shown) disposed on the bottom of the mount 20.

In addition, as shown in FIG. 4b, the second position sensor 128 may also be disposed in the second driving unit housing 122b of the second lens assembly, so that a position detection and a position control of the second lens assembly 120 may be performed.

Figure 6:
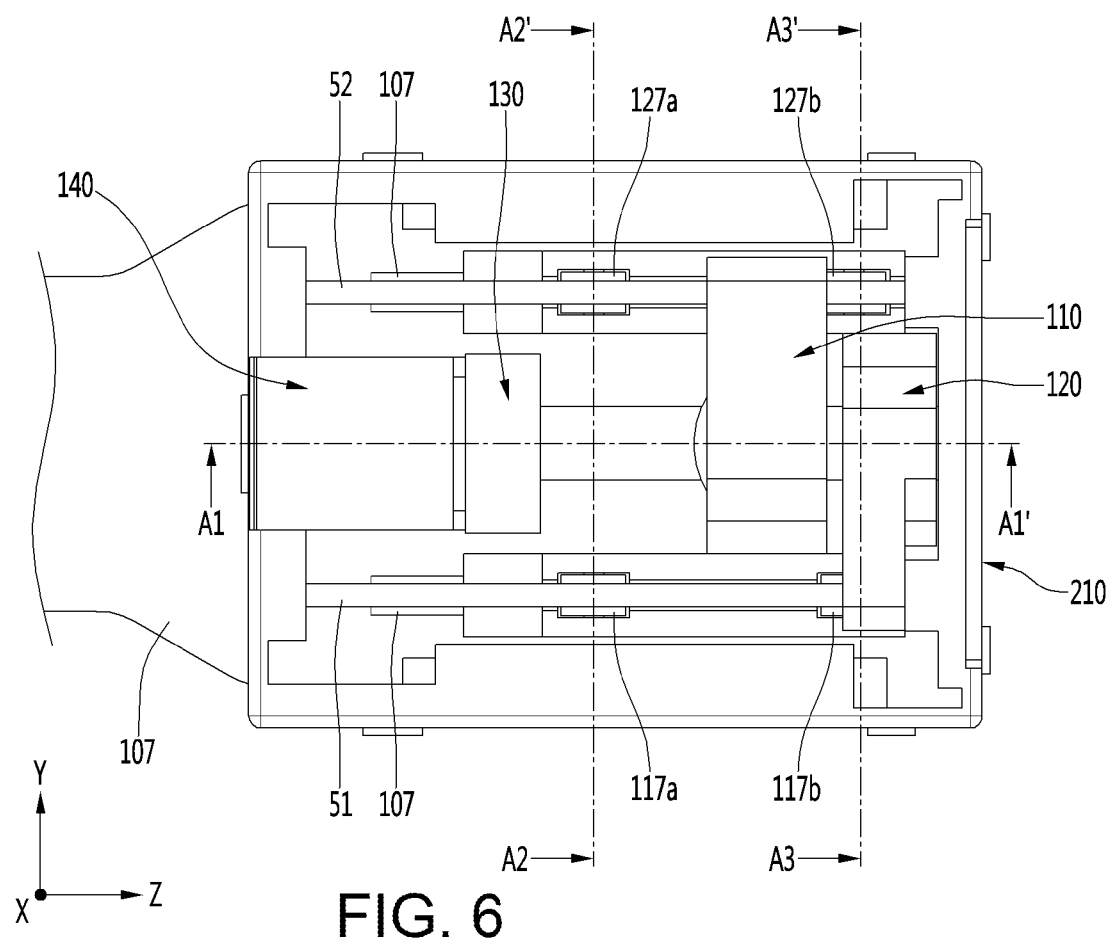
Figure 7A:
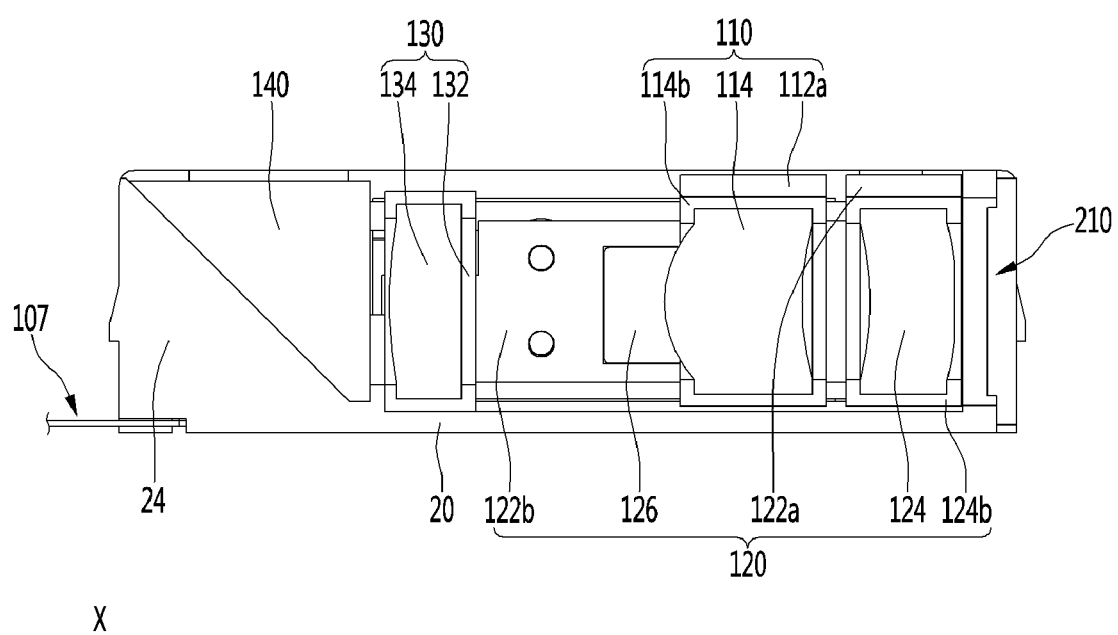
Figure 7B:
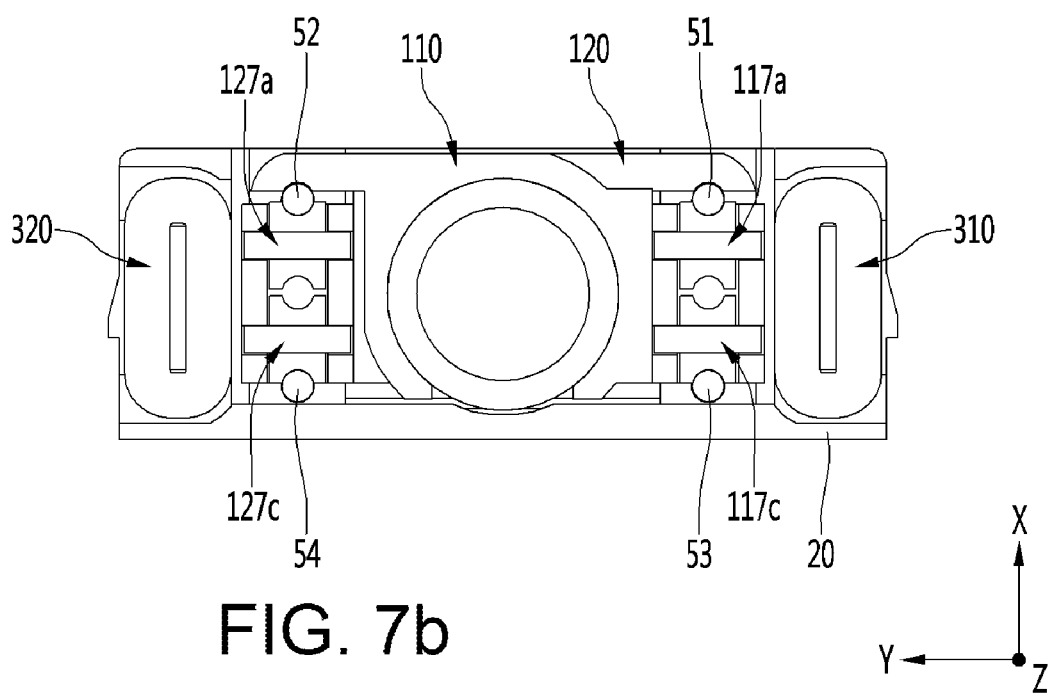
Figure 7C:
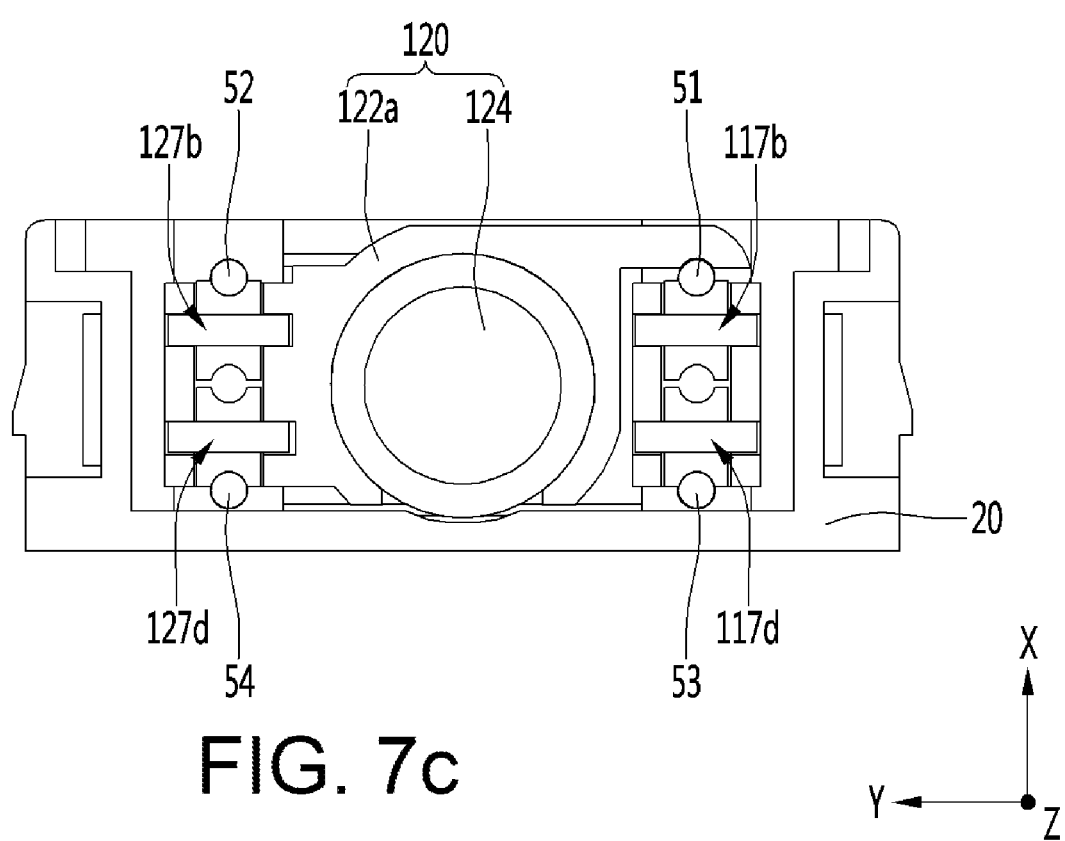

Next, FIG. 6 is a plan view of the camera module according to the embodiment shown in FIG. 2. In addition, FIG. 7a is a sectional view taken along line A1-A1' of the camera module according to the embodiment shown in FIG. 6 and directly viewed in the Y-axis direction. In addition, FIG. 7b is a sectional view taken along line A2-A2' of the camera module according to the embodiment shown in FIG. 6 and directly viewed in the Z-axis direction. In addition, FIG. 7c is a sectional view taken along line A3-A3' of the camera module according to the embodiment shown in FIG. 6 and directly viewed in the Z-axis direction.

First, in FIG. 7a, the second driving unit housing 122 and the fourth driving unit 126 of the second lens assembly 120 are not cut from each other.

Referring to FIG. 7a, the first lens group 114 may be mounted to the first lens housing 112a of the first lens assembly 110. The first lens group 114 may be mounted to a first lens barrel 114b.

In addition, the second lens group 124 may be mounted to the second lens housing 122a of the second lens assembly 120. The second lens group 124 may be mounted to a second lens barrel 124b.

In addition, the third lens group 130 may include a third lens 134 mounted to the third lens barrel 1132.

Each of the first to third lens groups 114, 124, and 134 may include one or a plurality of lenses.

In the camera module according to the embodiment, centers of the prism 140, the third lens group 130, the first lens group 114, and the second lens group 124 may be arranged in the optical axis direction Z.

The third lens group 130 may be disposed to face the prism 140, and light emitted from the prism 140 may be incident thereto.

At least one of the first to third lens groups 114, 124, and 134 may be a fixed lens. For example, the third lens group 130 may be fixed to the camera module and may not move in the optical axis direction, but the present invention is not limited thereto.

For example, the mount 20 may include a mounting portion (not shown) to which the third lens group 130 is fixedly coupled. The third lens group 130 may be mounted to the mounting portion, and fixed to the mounting portion by an adhesive.

The second lens group 124 may be spaced apart from the third lens group 130 in the optical axis direction, and may be moved in the optical axis direction. The third lens group 130 may be spaced apart from the second lens group 124 in the optical axis direction, and may be moved in the optical axis direction.

The light emitted from the third lens group 130 may enter the image sensor unit 210 disposed behind the third lens group 130.

The first lens group 114 and the second lens group 124 move in the optical axis direction, so that a distance between the first lens group 114 and the third lens group 130 and a distance between the first lens group 114 and the second lens group 124 may be adjusted, and accordingly, the camera module may perform the zooming function.

Next, FIG. 7B is a sectional view taken along line A2-A2' of the camera module according to the embodiment shown in FIG. 6 and directly viewed in the Z-axis direction, and shows states in which a first-1 wheel 117a and a first-3 wheel 117c are cut in the first lens assembly 110, and a second-1 wheel 127a and a second-3 wheel 127c are cut in the second lens assembly 120.

In the embodiment, the first lens assembly 110 includes the first-1 wheel 117a and the first-3 wheel 117c that serve as rolling driving units, and the second lens assembly 120 also includes the second-1 wheel 127a and the second-3 wheel 127c that serve as rolling driving units, thereby rolling and moving on the first rod 51, third rod 53, second rod 52 and fourth rod 54, respectively, by electromagnetic force, so that the occurrence of friction torque can be minimized.

Accordingly, the lens assembly, the lens driving device, and the camera module including the same according to the embodiment minimize the occurrence of friction torque between the guide rod 50 and the wheel of the lens assembly serving as a rolling driving unit to move in the optical axis direction Z during zooming, so that a driving power can be improved. In addition, according to the embodiment, a frictional resistance between the wheel of the lens assembly and the rod 50 may be minimized, so that there are technical advantages that a power consumption can be reduced when the camera module performs the zooming, and control properties can be improved.

Next, FIG. 7c is a sectional view taken along line A3-A3' of the camera module according to the embodiment shown in FIG. 6 and directly viewed in the Z-axis direction, and shows states in which a first-2 wheel 117b and a first-4 wheel 117c are cut in the first lens assembly 110, and a second-2 wheel 127b and a second-4 wheel 127d, the second lens housing 122a, and the second lens group 124 are cut in the second lens assembly 120.

In the embodiment, the first lens assembly 110 includes the first-2 wheel 117b and the first-4 wheel 117d that serve as rolling driving units, and the second lens assembly 120 also includes the second-2 wheel 127b and the second-4 wheel 127d that serve as rolling driving units, thereby rolling and moving on the first rod 51, third rod 53, second rod 52 and fourth rod 54, respectively, so that the occurrence of friction torque can be minimized.

Thus, according to the embodiment, the occurrence of friction torque between the wheel of the lens assembly and the rod 50 is minimized during zooming, so that there are complex technical advantages in that the driving power can be improved, the power consumption can be reduced, and the control properties can be improved.

Figure 8:
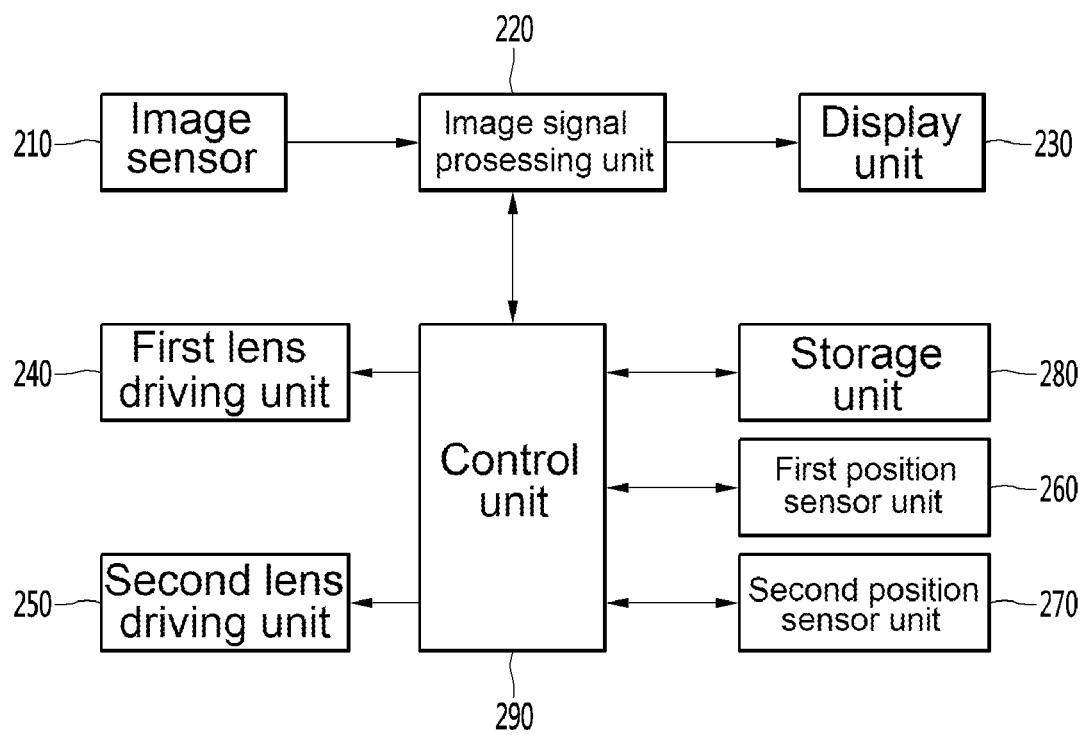

FIG. 8 is a block diagram showing an internal configuration of the camera module according to an embodiment of the present invention.

Referring to FIG. 8, the camera module may include an image sensor 210, an image signal processing unit 220, a display unit 230, a first lens driving unit 240, a second lens driving unit 250, a first position sensor unit 260, a second position sensor unit 270, a storage unit 280, and a control unit 290.

The image sensor 210 may process an optical image of the subject formed through the lens as described above. To this end, the image sensor 210 may pre-process the image obtained through the lens. In addition, the image sensor 210 may convert and output the pre-processed image into electrical data.

The image sensor 210, which has a configuration formed by integrating a plurality of photo detectors as each pixel, may convert and output image information of the subject into electrical data. The image sensor 210 may accumulate an amount of inputted light, and output the image captured by the lens to correspond to a vertical synchronization signal according to the accumulated amount of light. The image acquisition is performed by the image sensor 210 that converts light reflected and outputted from the subject into an electrical signal. Meanwhile, a color filter is required to obtain a color image using the image sensor 210. For example, a color filter array (CFA) filter may be employed. The CFA allows only light representing one color per pixel to be passed, has a regularly arranged structure, and has various forms according to the arranged structure.

The image signal processing unit 220 processes the image, which is outputted through the image sensor 210, by unit of frame. The image signal processing unit 220 may also be referred to as an image signal processor (ISP).

The image signal processing unit 220 may include a lens shading compensation unit (not shown). The lens shading compensation unit may serve as a block to compensate for lens shading phenomenon in which an amount of light at a central area of an image appears differently from an amount of light at a peripheral area, and compensate for colors of the central and peripheral areas of the image after receiving a lens shading setting value from the control unit 270 described later.

Further, the lens shading compensation unit may receive a shading variable set differently according to a type of lighting, and process a lens shading of the image so as to be suitable for the received variable. Accordingly, the lens shading compensation unit may process the lens shading by applying a different degree of shading according to the type of lighting. Meanwhile, the lens shading compensation unit may receive a shading variable set differently according to an automatic exposure weight applied to a specific area of the image, and process a lens shading of the image so as to be suitable for the received variable, such that a saturation phenomenon in prevented from occurring in the image. More specifically, the lens shading compensation unit may compensate a change in brightness occurring in the peripheral area of the image signal as the automatic exposure weight is applied to the central area of the image signal. In other words, when the saturation of the image signal occurs due to lighting, the light intensity gradually decreases from the center to the outside in a concentric circular shape, so that the lens shading compensation unit may amplify a peripheral signal of the image signal to compensate for the brightness compared to the center.

Meanwhile, the image signal processing unit 220 may measure a sharpness of the image acquired through the image sensor 210. In other words, the image signal processing unit 220 may measure the sharpness of the image to check a focus accuracy of the image acquired through the image sensor 210. The sharpness may be measured with respect to each of images acquired according to positions of a focus lens.

The display unit 230 displays an image photographed under the control of the control unit 290 described later, and displays a setting screen required for taking a picture or a screen for selecting an action by a user.

The first lens driving unit 240 moves the first lens assembly. Preferably, the first lens driving unit 240 may move the first lens group included in the first lens assembly. Preferably, the first lens group may be a zoom lens. In addition, the first lens driving unit 240 may move the zoom lens in the optical axis direction to adjust a zoom position (or zoom magnification) of the zoom lens.

The second lens driving unit 250 moves the second lens assembly. Preferably, the second lens driving unit 250 may move the second lens group included in the second lens assembly as described above. The second lens group may include a focus lens. In addition, the second lens driving unit 250 may move the focus lens in the optical axis direction to adjust a focus position of the focus lens.

The first position sensor unit 260 includes the first position sensor 118 described above, and accordingly, detects the position of the first lens assembly 110. Preferably, the first position sensor unit 260 may detect a position of the third driving unit 116 disposed in the first lens assembly 110. Preferably, the first position sensor unit 260 may detect a position of the first lens assembly 110 in order to control the position of the first lens assembly 110.

In other words, the first position sensor unit 260 provides position data for moving the first lens assembly through the first lens driving unit 240.

The second position sensor unit 270 includes the second position sensor 128 described above, and accordingly, detects a position of the second lens assembly 120. Preferably, the second position sensor unit 270 may detect a position of the fourth driving unit 126 disposed on the second lens assembly 120. Preferably, the second position sensor unit 270 may detect a position of the second lens assembly 120 in order to control the position of the second lens assembly 120.

In other words, the second position sensor unit 270 provides position data for moving the second lens assembly through the second lens driving unit 250.

The storage unit 280 stores data necessary for operating the camera module 100. In particular, the storage unit 280 may store information on a zoom position and a focus position for each distance to the subject. In other words, the focus position may be a position of the focus lens to accurately focus the subject. In addition, the focus position may vary according to a zoom position with respect to the zoom lens and a distance to the subject. Accordingly, the storage unit 280 stores data on a zoom position and a focus position corresponding to the zoom position according to a distance.

The control unit 290 controls overall operations of the camera module. In particular, the control unit 290 controls the first position sensor unit 260 and the second position sensor unit 270 to provide the auto focus function.

In other words, the control unit 290 enables the first position sensor unit 260 to detect the position of the first lens assembly. Preferably, the control unit 290 enables the first position sensor unit 260 to detect a present position of the first lens assembly so as to move the first lens assembly to a target position.

In addition, when the present position of the first lens assembly is detected through the first position sensor unit 260, the control unit 290 supplies a control signal for moving the first lens assembly to the target position to the first lens driving unit 240 based on the present position of the first lens assembly.

In addition, the control unit 290 enables the second position sensor unit 270 to detect the position of the second lens assembly. Preferably, the control unit 290 enables the second position sensor unit 270 to detect a present position of the second lens assembly so as to move the second lens assembly to a target position.

In addition, when the present position of the second lens assembly is detected through the second position sensor unit 260, the control unit 290 supplies a control signal for moving the second lens assembly to the target position to the second lens driving unit 240 based on the present position of the second lens assembly.

Differential signals of the detection signals detected by a plurality of sensor units constituting each sensor unit are inputted to the control unit 290 through the first position sensor unit 260 and the second position sensor unit 270.

In other words, according to the present invention, each of the first position sensor unit 260 and the second position sensor unit 270 includes a plurality of sensor units. In addition, the sensor units perform a detection operation at each installation position. According to the present invention, positions of the first lens assembly and the second lens assembly are detected using differential signals of the detection signals acquired through the sensor units, respectively.

In general, the control unit 290 may receive the signals detected by the sensor units, and accordingly, the positions of the first lens assembly or the second lens assembly may be detected based on the differential signal therefor.

However, in the above structure, an amplifier and an analog-to-digital converter are required to be disposed in each of the sensor units. In addition, the control unit 290 is required to be provided with a plurality of connection terminals connected to the analog-to-digital converter connected to each sensor unit. In addition, offset noise may occur on a path from the sensor units to the control unit 290.

Accordingly, in the present invention, digital data for the differential signal may be acquired at a front-end terminal, and accordingly, the acquired digital data may be inputted to the control unit 290.

In other words, in the present invention, the digital data may be acquired in the first position sensor unit 260 and the second position sensor unit 270, and accordingly, only the acquired digital data may be inputted to the control unit 290.

Hereinafter, the first position sensor unit 260 and the second position sensor unit 270 will be described in detail.

Figure 9:
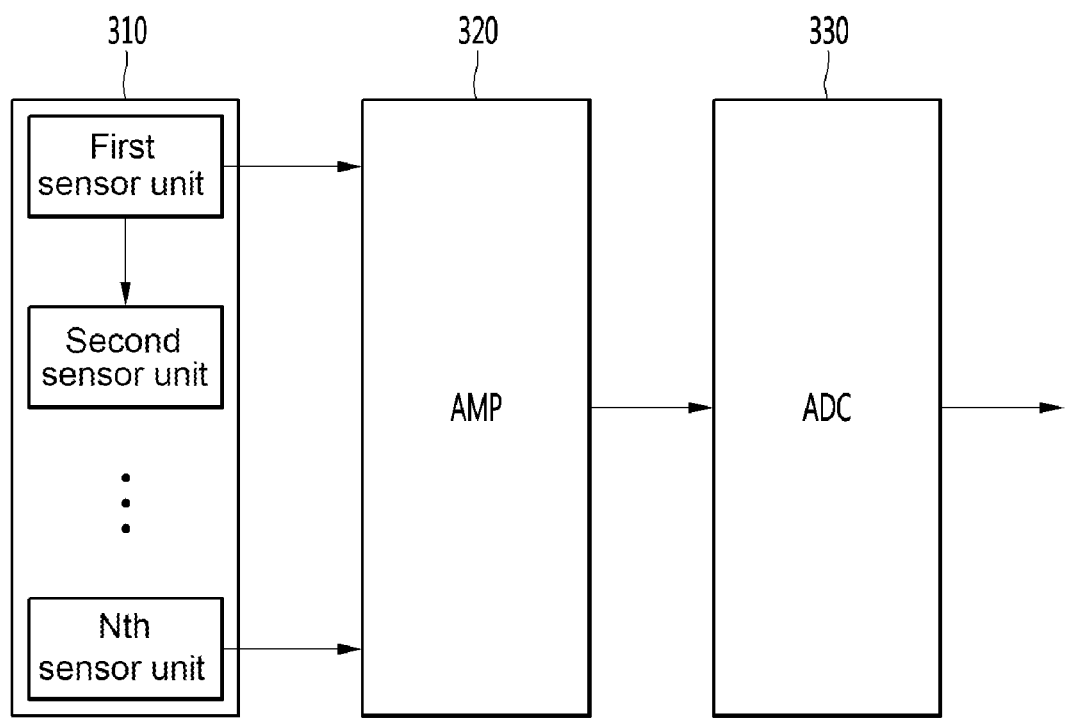

FIG. 9 is a block diagram showing a detailed configuration of a position sensor unit of FIG. 8.

The elements shown in FIG. 9 represent any one position sensor unit of the first position sensor unit 260 and the second position sensor unit 270. The first position sensor unit 260 and the second position sensor unit 270 may have the same configuration as each other, and accordingly, may be connected to the control unit 290.

Referring to FIG. 9, each of the first position sensor unit 260 and the second position sensor unit 270 includes a plurality of sensor units 310, an amplifier 320, and an analog-to-digital converter 330.

The sensor units 310 include a sensor for position detection. Preferably, the sensor units 310 may include a plurality of Hall sensors. In contrast, the sensor units 310 may include a plurality of induction coils.

In the sensor units 310, two sensors disposed at the outermost side are connected to the amplifier 320, and the remaining sensor units are connected to neighboring sensor units. The connection structure of the sensor units 310 will be described in more detail as below.

In other words, according to the present invention as described in the above manner, the sensor units 310 are connected to each other, and accordingly, an output terminal of the sensor unit positioned at the outermost side is connected to the amplifier 320. Accordingly, a sum signal for detection signals detected by the sensor units is inputted to the amplifier 320, which is expressed as the sum of sensing ranges of the sensor unit, and accordingly, the sensing range for the sensor units 310 inputted to the amplifier 320 extends compared to a single sensor unit.

The amplifier 320 includes a non-inverting terminal (+) and an inverting terminal (−). In addition, the amplifier 320 differentially amplifies and outputs a signal inputted to the non-inverting terminal (+) and a signal inputted to the inverting terminal (−) into the analog-to-digital converter 330. In other words, output signals for the sensor units 310 have a magnitude of several mV, which is a magnitude that does not match the input range of the analog-to-digital converter 330 in view of the ratio. Accordingly, the amplifier 320 differentially amplifies and outputs the signals inputted through the non-inverting terminal (+) and the inverting terminal (−) so as to match the input range of the analog-to-digital converter 330.

The analog-to-digital converter 330 receives an analog signal from the amplifier 320, and accordingly, converts and outputs the received analog signal into a digital signal.

Preferably, the analog-to-digital converter 330 receives the analog signal from the amplifier 320 and outputs the received analog signal into a multi-bit digital signal. The output signal of the analog-to-digital converter 330 may be expressed as a value of 0 and 1.

The sensor units 310 according to the first embodiment of the present invention may be composed of a plurality of Hall sensors 310A.

Hereinafter, the interconnection relationship of the Hall sensors will be described in the case that the sensor units 310 are composed of the Hall sensors.

FIGS. 10a to 10d are views for explaining a connection relationship of the sensor units of FIG. 9.

Figure 10A:
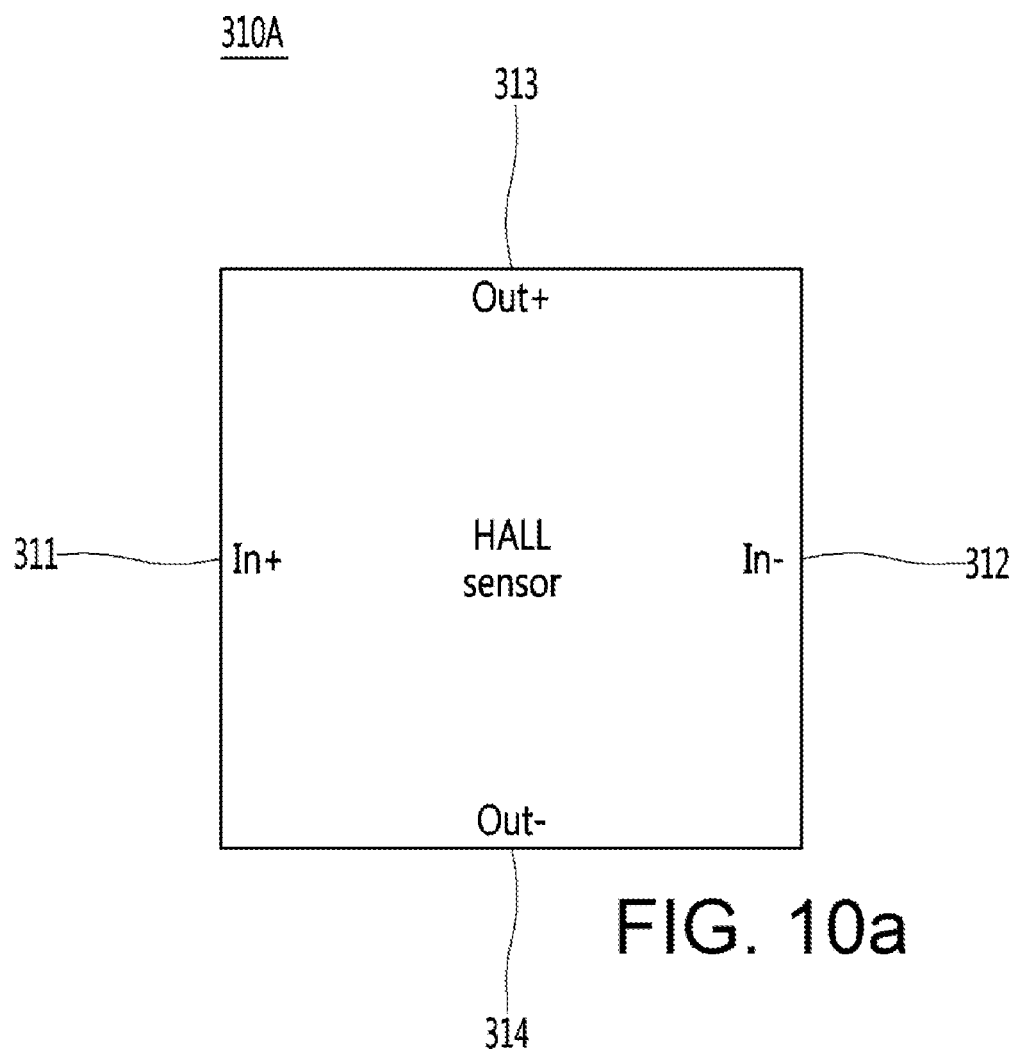

Referring to FIG. 10a, the Hall sensors constituting the sensor units 310 include four terminals. Two of the four terminals are input terminals, and the remaining two terminals are output terminals.

In addition, the two input terminals are power input terminals, and the two output terminals are output terminals of the detection signals.

Preferably, the Hall sensor includes a first power terminal 311, a second power terminal 312, a first detection signal output terminal 313, and a second detection signal output terminal 314. In addition, the first power terminal 311 is a terminal to which power of a positive polarity is inputted, and the second power terminal 312 is a terminal to which power of a negative polarity is inputted. In addition, the first detection signal output terminal 313 is a terminal through which a detection signal of a positive polarity is outputted, and the second detection signal output terminal 314 is a terminal through which a detection signal of a negative polarity is outputted.

The Hall sensors constituting the sensor units 310 may indicate a different connection relation between the two output terminals according to arranged positions on the camera module.

In other words, each first power terminals 311 of the Hall sensors is connected to a power source of a positive polarity, and the second power terminal 312 is connected to a power (or ground) of a negative polarity.

In addition, the detection signal output terminals of the Hall sensors may have different connection relationships according to the arrangement positions. At least two Hall sensors are provided. In other words, the sensor units include at least two sensor units.

The case will be described in which the sensor units are composed of three Hall sensors. When the sensor units are composed of three Hall sensors, two of the Hall sensors may be disposed at outer sides, and the remaining one Hall sensor may be disposed between the two Hall sensors disposed at the outer sides. In addition, in the one Hall sensor between the two Hall sensors disposed at the outer sides, the first detection signal output terminal 313 and the second detection signal output terminal 314 are connected to output terminals of two Hall sensors disposed at the outer sides, respectively. In addition, in each of the two Hall sensors disposed on the outer sides, one of the two output terminals is connected to the amplifier 320, and the other output terminal is connected to the neighboring Hall sensor.

Figure 10B:
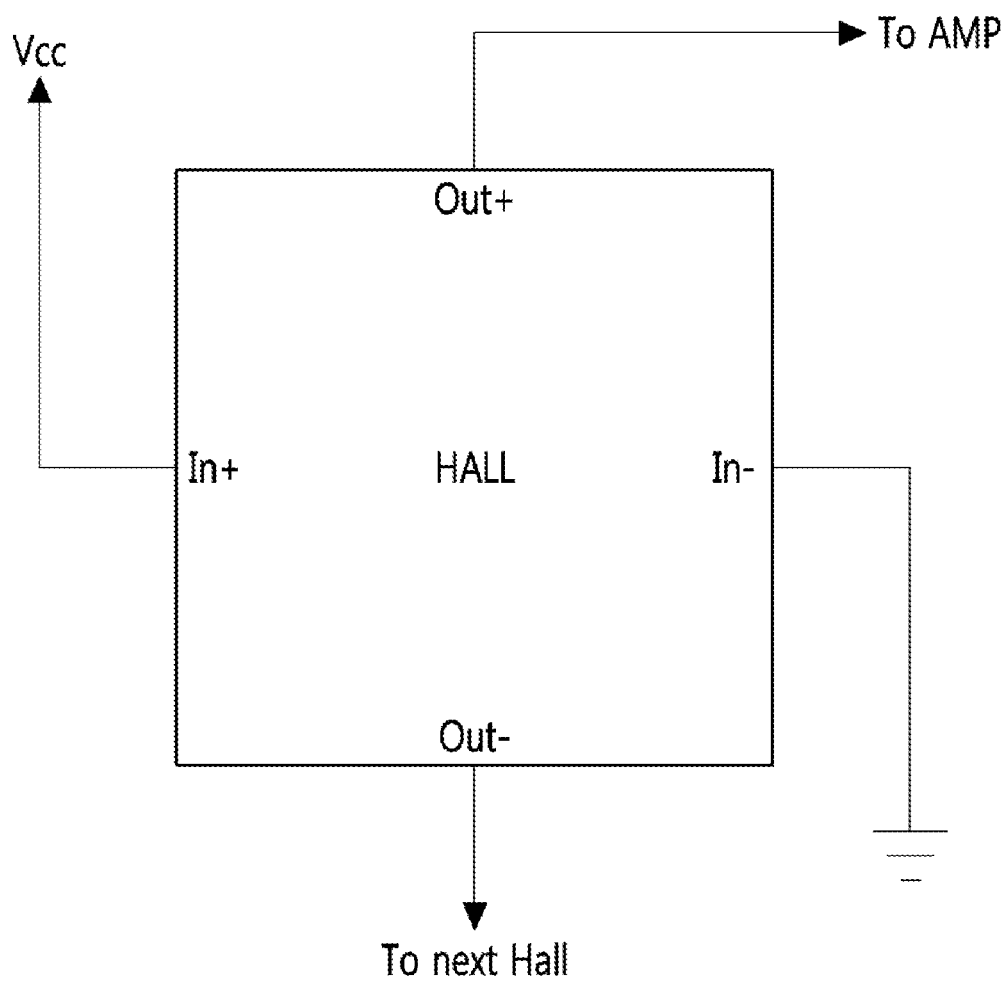

In other words, FIG. 10b is a diagram illustrating a connection relationship of output terminals of a Hall sensor disposed first among the Hall sensors. Referring to FIG. 10b, the first Hall sensor disposed first includes the first detection signal output terminal 313 and the second detection signal output terminal 314, in which the first detection signal output terminal 313 is connected to a non-inverting terminal (+) of the amplifier 320, and the second detection signal output terminal 314 is connected to a first detection signal output terminal of the neighboring Hall sensor. In other words, the second detection signal output terminal 314 of the first Hall sensor disposed first is connected to a first detection signal output terminal of a Hall sensor disposed second.

Figure 10C:
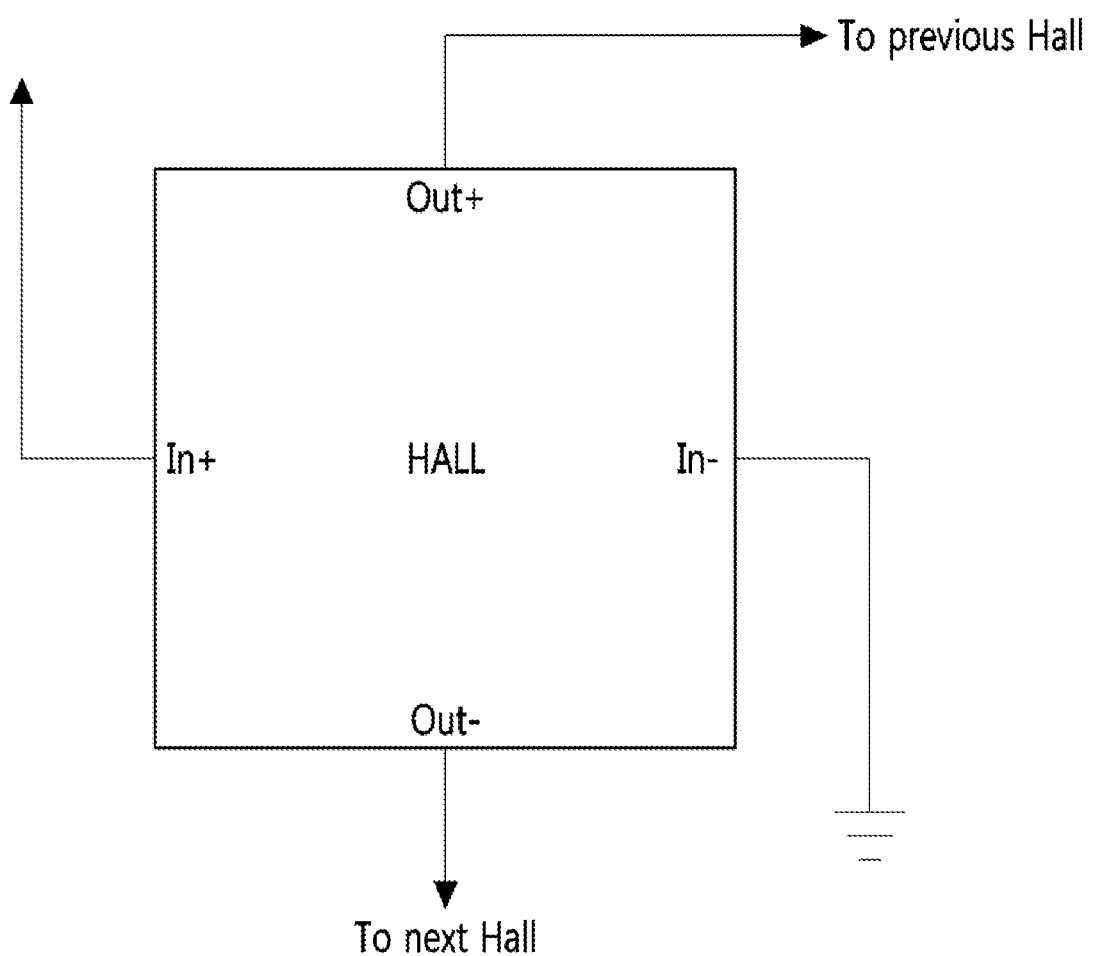

In addition, FIG. 10c is a diagram illustrating a connection relationship of output terminals of a Hall sensor between the Hall sensors disposed at the outer sides. In other words, FIG. 10c is a diagram illustrating a connection relationship of output terminals of remaining Hall sensors among the Hall sensors other than the Hall sensor disposed first and the Hall sensor disposed last.

Referring to FIG. 10c, the second Hall sensor among the Hall sensors other than the Hall sensor disposed first and the Hall sensor disposed last includes the first detection signal output terminal 313 and the second detection signal output terminal 314. In addition, the first detection signal output terminal 313 of the second Hall sensor is connected to a second detection signal output terminal of a Hall sensor disposed previously, and the second detection signal output terminal 314 is connected to a first detection signal output terminal of a Hall sensor disposed next. In other words, a first detection signal output terminal of the Hall sensor disposed second is connected to the second detection signal output terminal of the Hall sensor disposed first, and a second detection signal output terminal of the Hall sensor disposed second is connected to a first detection signal output terminal of a Hall sensor disposed third.

Figure 10D:
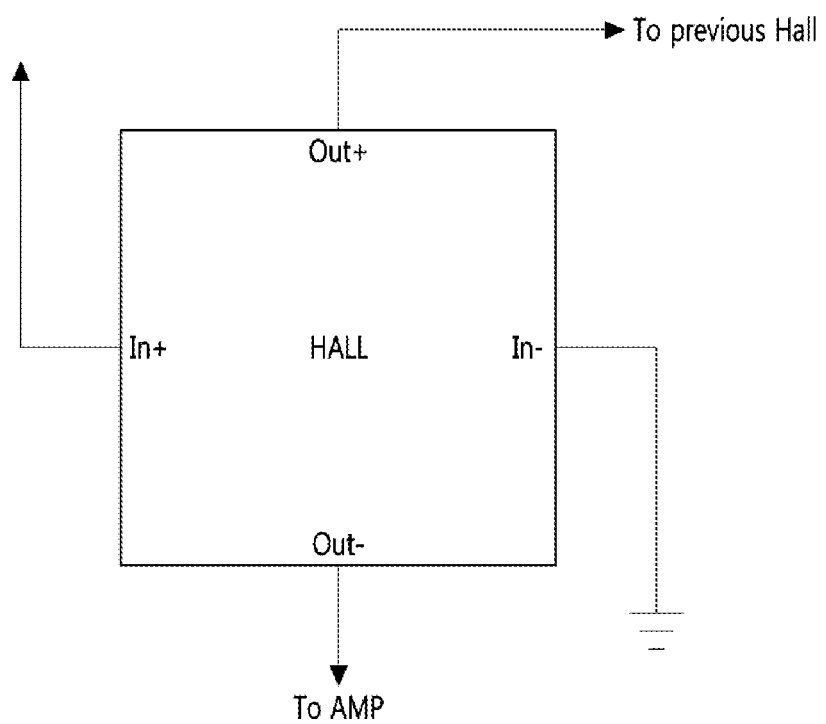

FIG. 10d illustrates a connection relationship of output terminals of the Hall sensor disposed last. A third Hall sensor disposed last includes the first detection signal output terminal 313 and the second detection signal output terminal 314. In addition, the first detection signal output terminal 313 of the third Hall sensor is connected to a second detection signal output terminal of a Hall sensor disposed previously, and the second detection signal output terminal 314 is connected to an inverting terminal (−) of the amplifier 320.

As described above, according to the present invention, only one of the two output terminals included in each of the two Hall sensors disposed at the outer sides may be connected to the amplifier 320, and all of remaining terminals may be connected to the output terminals of neighboring Hall sensors, respectively. In the case of the above connection structure, a signal corresponding to the sum of the sensing ranges of the Hall sensors is inputted to the amplifier 320, and accordingly, the amplifier 320 differentially amplifies and outputs the inputted signal.

In the embodiment according to the present invention, the position sensors such as multiple Hall sensors may be connected to each other, and accordingly, only the output terminal of the position sensor disposed at the outermost side may be connected to the amplifier. Accordingly, in the present invention, differential signals for the position sensors can be inputted to an input terminal of the amplifier.

According to the present invention, a differential sensing scheme can be provided in which a detection range becomes wider compared to a single sensing scheme. In addition, according to the present invention, a differential signal according to a combination of the position sensors may be inputted to the input terminal of the amplifier, so that the exposure of the output signal of the position sensor to offset noise in a path to the control unit can be minimized.

In addition, according to the present invention, differential signals for the position sensors are outputted in the sensing unit including the position sensors, the amplifier, and the analog-to-digital converter, so that the number of patterns/pins connected from the driving unit to a printed circuit board can be minimized, and accordingly, a space of the printed circuit board can be saved.

In addition, according to the present invention, the differential value for the position sensors may be obtained with respect to common mode noise, so that excellent characteristics not only for internal noise but also for external noise can be implemented.

In addition, according to the present invention, only a detection signal of a specific position sensor can be transmitted to a terminal of the amplifier, or differential signals for a plurality of position sensors can be transmitted, according to the usage environment of the camera module. According to the present invention, optimal detection signals can be acquired in an environment in which the sensing sensitivity is required to be large and an environment in which the sensing range is required to be large.

Figure 11:
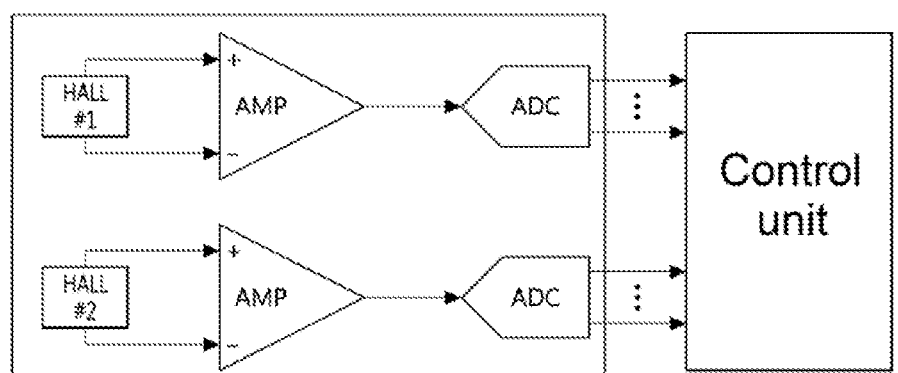
Figure 11:
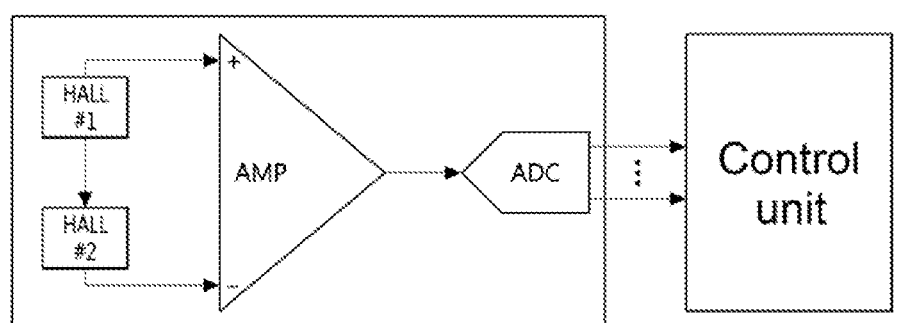

FIG. 11 is a view comparing a connection relationship of a sensor unit according to a Comparative Example and a connection relationship of the sensor unit according to the present invention.

In other words, a plurality of position sensors may be arranged such that the sensing range of the position sensor is widened, and accordingly, the control unit 290 may calculate and use differential signals for the position sensors.

In other words, as shown in FIG. 11(a), in the Comparative Example, output terminals of a plurality of Hall sensors are connected to different amplifiers, respectively. In addition, the amplifiers connected to the Hall sensors are connected to different analog-to-digital converters, respectively. Accordingly, the control unit is required to be provided with input pins connected to a plurality of analog-to-digital converters. Each of the analog-to-digital converters outputs a multi-bit digital signal through a plurality of signal lines, and accordingly, the number of input pins required by the control unit increases proportionally as the number of analog-to-digital converters increases. In addition, in the Comparative Example, the amplifier and the analog-to-digital converter are required to be provided as many as the number of Hall sensors.

However, according to the present invention, one of the two output terminals of the Hall sensor disposed at the outer sides among the Hall sensors may be connected to the non-inverting terminal (+) and the inverting terminal (−) of the amplifier 320, and the remaining output terminal included in the Hall sensors may be connected to an output terminal of Hall sensors adjacent to each other. According to the present invention, the number of input pins required by the control unit 290 may be minimized, and the exposure of the detection signal to the offset noise in the path moving to the control unit 290 may be minimized.

Figure 12:
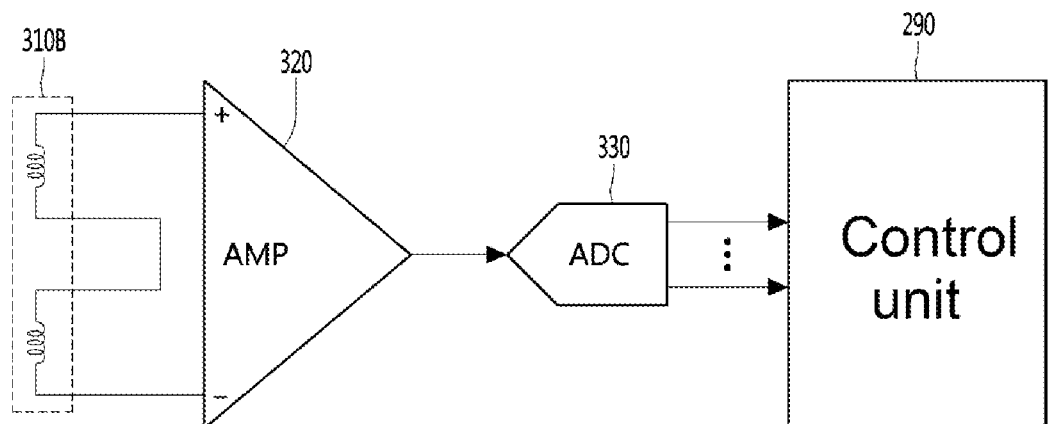

FIG. 12 is a view for explaining a connection relationship of a sensor unit according to another embodiment of the present invention.

Each of the sensor units has been described as being composed of a Hall sensor. However, according to the present invention, the sensor units may be composed of an induction coil other than the Hall sensor.

Referring to FIG. 12, the sensor units includes a plurality of induction coils. In addition, each of the induction coils includes two output terminals. One of the two output terminals may be one end of the induction coil, and the other of the two output terminals may be the other end of the induction coil.

In addition, the ends of the induction coils may be connected to an end of the neighboring induction coil or may be connected to a non-inverting terminal (+) or an inverting terminal (−) of the amplifier 320, so as to correspond to the connection relationship of the Hall sensors.

In other words, a first output terminal of an induction coil disposed first may be connected to the non-inverting terminal (+) of the amplifier 320. In addition, a second output terminal of the induction coil disposed first may be connected to a first output terminal of a next neighboring induction coil.

In addition, a first output terminal of the induction coil disposed second may be connected to a second output terminal of an induction coil disposed previously, and a second output terminal of the induction coil disposed second may be connected to a first output terminal of a next induction coil.

In addition, a first output terminal of an induction coil disposed last may be connected to a second output terminal of an induction coil disposed previously, and a second output terminal of the induction coil disposed last may be connected to the inverting terminal (−) of the amplifier 320.

Figure 13:
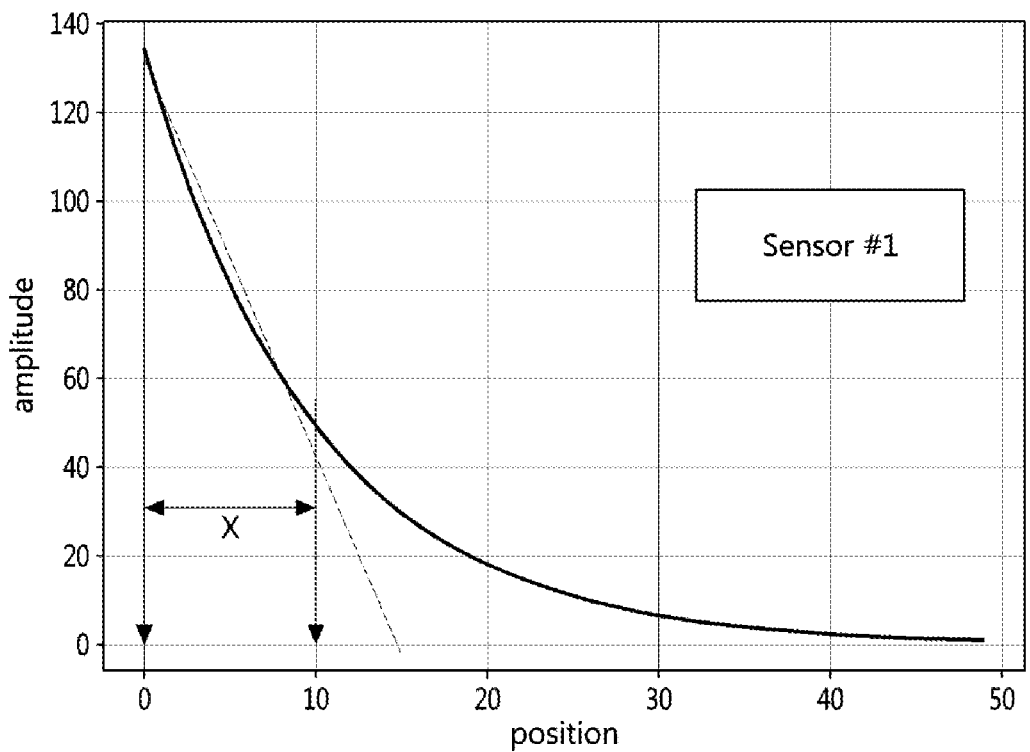
Figure 14:
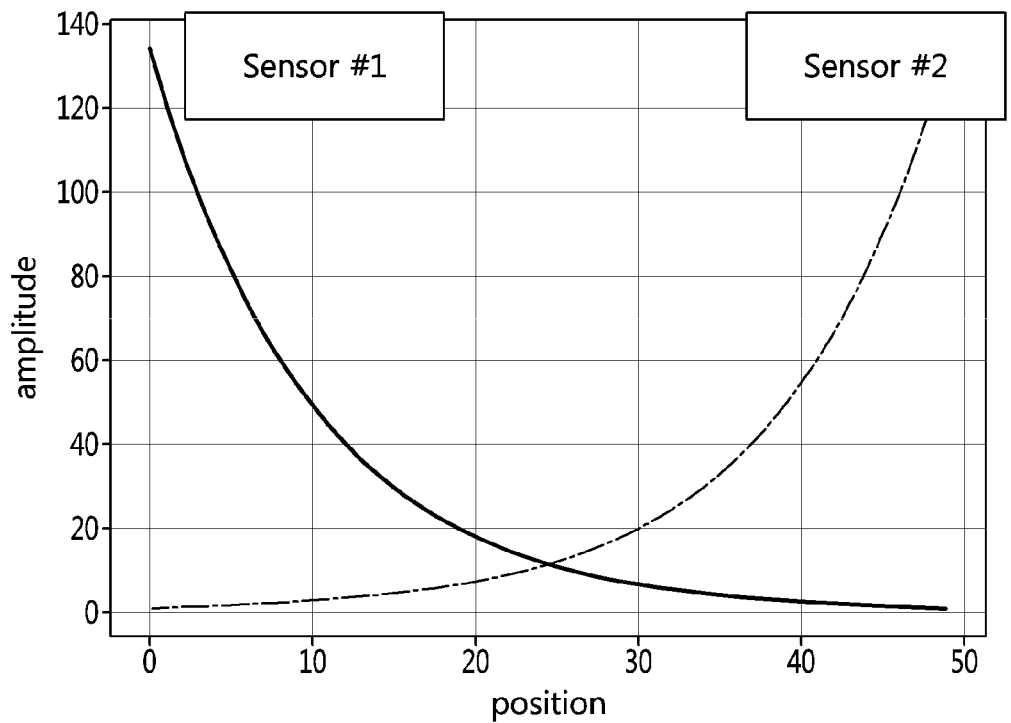
Figure 14:
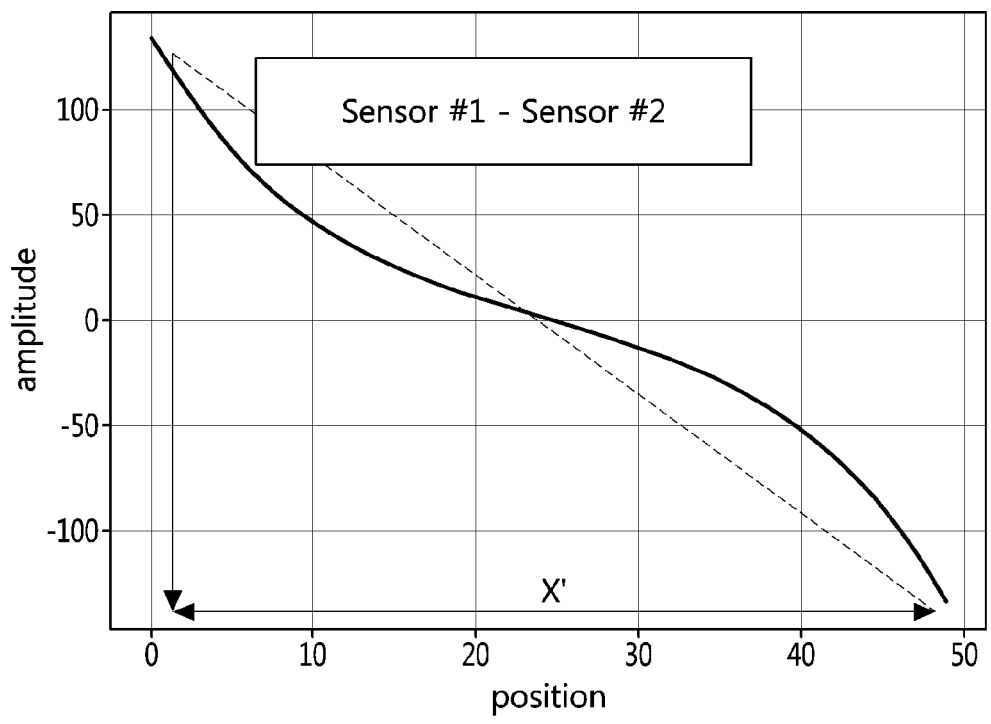

FIG. 13 is a view showing a detection range of a position sensor unit according to the Comparative Example. FIG. 14 is a view showing a detection range of a position sensor unit according to the embodiment of the present invention.

Referring to FIG. 13, when the sensor unit constituting the position sensor unit is a single sensor unit, a sensing range of the position sensor unit may be considerably narrow. In other words, according to the conventional sensing method, an output of only one sensor is used, in which only the linear section (X section) of the output of the one sensor is used.

Unlikely, referring to FIG. 14, in the present invention, the position sensor unit includes a plurality of sensor units, and accordingly, the sensing range is determined based on differential signals for the sensor units. Accordingly, the present invention may provide a position sensing unit having the sensing range wider than that of the Comparative Example as in FIG. 13.

Figure 15:
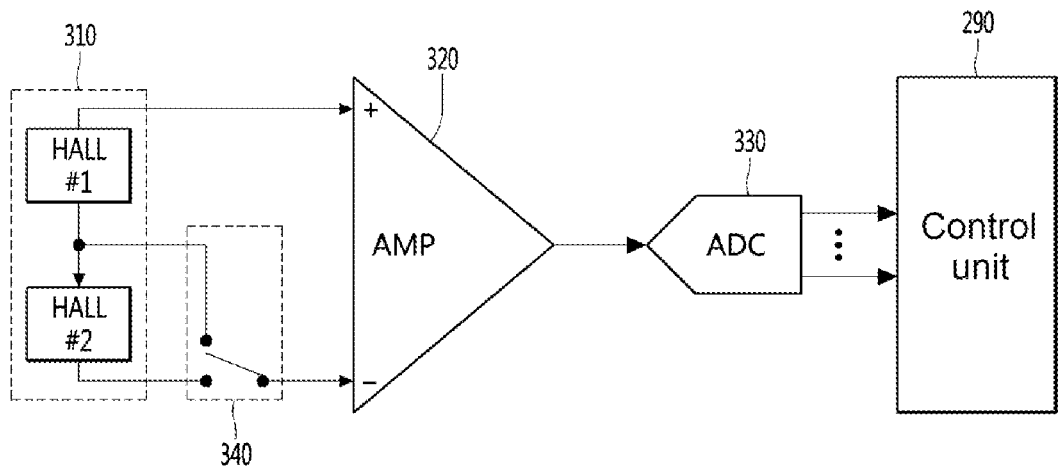

FIG. 15 is a block diagram showing a detailed configuration of the position sensor unit according to another embodiment of the present invention.

Meanwhile, the position sensor unit as described above provides signals to the amplifier 320 through the structure in which a plurality of sensor units are interconnected. In the above connection structure, the sensing range for the detection signals of the sensor units may be significantly increased, however, the sensing sensitivity may decrease compared to the single sensor scheme.

According to the present invention, a detection signal subject to connection with a plurality of sensor units may be supplied to the amplifier 320, or only the detection signal for a specific sensor unit among the sensor units may be transmitted to the amplifier 320, according to operating conditions of the camera module.

To this end, as shown in FIG. 15, the position sensor unit further includes a switch 340.

The switch 340 has one end connected to the inverting terminal (−) of the amplifier 320, and the other end connected to any one of the output terminals of the sensor units.

In other words, when the sensor units include two Hall sensors, the switch 340 may be connected to the second detection signal output terminal of the Hall sensor disposed first, or connected to the second detection signal output terminal of the Hall sensor disposed second.

When the switch 340 is connected to the second detection signal output terminal of the Hall sensor disposed first, only the output signal of the Hall sensor disposed first is inputted to the amplifier 320. According to the present invention, the amplifier 320 is configured to be connected only to the specific Hall sensor, so that an optimal sensing sensitivity may be provided under conditions requiring a sensing sensitivity.

In addition, when the switch 340 is connected to the second detection signal output terminal of the Hall sensor disposed second, a combined signal of output signals arranged in the Hall sensor disposed first and the Hall sensor disposed second may be inputted to the amplifier 320. According to the present invention, the amplifier 320 is connected to the Hall sensors, so that an optimal sensing range may be provided under conditions requiring a sensing range.

In the embodiment according to the present invention, the position sensors such as multiple Hall sensors may be connected to each other, and accordingly, only the output terminal of the position sensor disposed at the outermost side may be connected to the amplifier. According to the present invention, differential signals for the position sensors can be inputted to an input terminal of the amplifier.

According to the present invention, a differential sensing scheme can be provided in which a detection range becomes wider compared to a single sensing scheme. In addition, according to the present invention, a differential signal according to a combination of the position sensors may be inputted to the input terminal of the amplifier, so that the exposure of the output signal of the position sensor to offset noise in a path to the control unit can be minimized.

In addition, according to the present invention, differential signals for the position sensors are outputted in the sensing unit including the position sensors, the amplifier, and the analog-to-digital converter, so that the number of patterns/pins connected from the driving unit to a printed circuit board can be minimized, and accordingly, a space of the printed circuit board can be saved.

In addition, according to the present invention, the differential value for the position sensors may be obtained with respect to common mode noise, so that excellent characteristics not only for internal noise but also for external noise can be implemented.

In addition, according to the present invention, only a detection signal of a specific position sensor can be transmitted to a terminal of the amplifier, or differential signals for a plurality of position sensors can be transmitted, according to the usage environment of the camera module. According to the present invention, optimal detection signals can be acquired in an environment in which the sensing sensitivity is required to be large and an environment in which the sensing range is required to be large.

Figure 16:
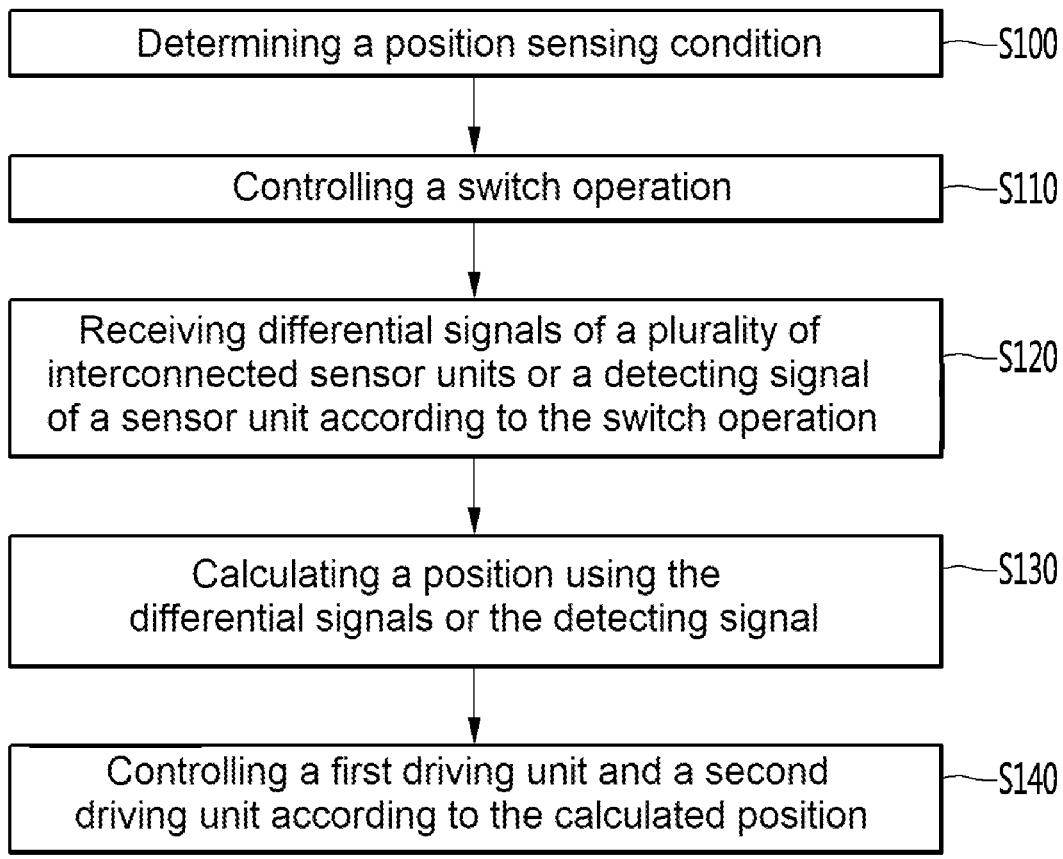

FIG. 16 is a flow chart for explaining an operation method for the camera module step-by-step according to the embodiment of the present invention.

First, the control unit 290 determines position sensing conditions for the first and second lens assemblies of the camera module (step 110). In the determining of the position sensing conditions, whether the present operating condition is a condition requiring a sensing sensitivity or a condition requiring a sensing range so as to acquire position data may be determined. For example, when a moving range of the lens assembly is wide, a wide sensing range may be required for an accurate position detection. In contrast, when the lens assembly has a small moving range and a minute movement, an accurate sensing sensitivity may be required rather than the wide sensing range. Accordingly, the control unit may determine the position sensing condition.

In addition, the control unit 290 controls a switching operation of the switch 340 according to the determined position sensing condition (step 120).

Then, the control unit 290 receives differential signals from a plurality of sensor units connected to each other or a detection signal from a specific sensor unit according to the operation of the switch 340 (step 130).

In addition, the control unit 290 may calculate present positions of the first or second lens assemblies based on the received signal (step 140).

In addition, when the present position is calculated, the control unit 290 outputs a control signal to the first lens driving unit 240 or the second lens driving unit 250 according to a difference between the calculated present position and a target position (step 150).

The features, structures, effects and the like described in the above embodiments are included in at least one embodiment and are not limited to one embodiment only. Further, with respect to the features, structures, effects, and the like described in the embodiments, other embodiments may be carried out with combinations or modifications by a person having ordinary skill in the art. Accordingly, the contents relevant to the combinations and modifications should be construed as being included in the scope of the embodiments.

Although the exemplary embodiments have been proposed and set forth in the aforementioned description, the present invention should not be construed as limited to the embodiments. It will be apparent that various deformations and modifications not illustrated are available within the scope without departing from inherent features of the embodiments of the present invention by the person having ordinary skill in the art. For example, each element specifically shown in the embodiments may be carried out with the modifications. Further, it is apparent that differences relevant to the modifications and deformations are included in the scope of the embodiments set in the accompanying claims of the present invention.

The invention claimed is:

1. A camera module comprising:
 a lens assembly;
 a lens driving unit for moving the lens assembly in an optical axis direction;
 a position sensor unit for detecting a position of the lens assembly; and
 a control unit configured to output a driving signal, for moving the lens assembly to a target position, to the lens driving unit based on the position of the lens assembly detected through the position sensor unit,
 wherein the position sensor unit includes a plurality of sensor units with at least one output terminal interconnected to each other, the sensor units including a first Hall sensor and a second Hall sensor, an amplifier commonly connected to the sensor units, an analog-to-digital converter connected to the amplifier, and a switch having one end connected to the inverting terminal of the amplifier and an opposite end selectively connected to any one of the output terminal having a negative polarity of the first Hall sensor and the output terminal having a negative polarity of the second Hall sensor.

2. The camera module of claim 1, wherein the amplifier includes the inverting terminal and a non-inverting terminal, in which the inverting terminal of the amplifier is connected to a first output terminal of first Hall sensor, and connected to a second output terminal of the second Hall sensor.

3. The camera module of claim 2, wherein the first Hall sensor is disposed first among the sensor units, and the second Hall sensor is disposed last among the sensor units.

4. The camera module of claim 3, wherein the first output terminal is an output terminal of a positive polarity of the first Hall sensor, and the second output terminal is the output terminal of the negative polarity of the second Hall sensor.

5. The camera module of claim 4, wherein the output terminal having the negative polarity of the first Hall sensor may be connected to an output terminal having a positive polarity of the second Hall sensor.

6. The camera module of claim 4, wherein the sensor units further includes a third Hall sensor disposed between the first and second Hall sensors, in which an output terminal having a positive polarity of the third Hall sensor is connected to the output terminal having the negative polarity of the first Hall sensor, and an output terminal having a negative polarity of the third Hall sensor is connected to the output terminal having the positive polarity of the second Hall sensor.

7. The camera module of claim 1, wherein the lens assembly includes a first lens assembly including a zoom lens group, and a second lens assembly including a focus lens group, and the position sensor unit includes a first position sensor unit that detects a position of the first lens assembly, and a second position sensor unit that detects a position of the second lens assembly.

8. An operation method for a camera module, the operation method comprising:

determining a sensing condition of a position sensor unit;

allowing an inverting terminal of an amplifier to be connected to one of an output terminal of a first sensing unit and an output terminal of a last sensing unit among a plurality of sensing units by controlling a switch according to the determined sensing condition;

detecting a position of a lens assembly corresponding to a detection signal inputted to the amplifier by controlling the switch; and moving the lens assembly to a target position according to the detected position, wherein the detecting includes receiving an output signal of the first sensing unit when the inverting terminal is connected to the output terminal of the first sensing unit, and receiving a differential signal according to a combination of the sensing units when the inverting terminal is connected to the output terminal of the last sensing unit, wherein the first sensing unit is a first Hall sensor and the last sensing unit is a second Hall sensor, and wherein the switch has one end connected to the inverting terminal of the amplifier and an opposite end selectively connected to any one of the output terminal having a negative polarity of the first Hall sensor and the output terminal having a negative polarity of the second Hall sensor.

* * * * *